US011162191B2

(12) United States Patent
Maeda et al.

(10) Patent No.: US 11,162,191 B2
(45) Date of Patent: Nov. 2, 2021

(54) THERMAL PROCESSING METHOD FOR SILICON WAFER

(71) Applicant: GLOBALWAFERS JAPAN CO., LTD., Niigata (JP)

(72) Inventors: Susumu Maeda, Niigata (JP); Hironori Banba, Niigata (JP); Haruo Sudo, Niigata (JP); Hideyuki Okamura, Niigata (JP); Koji Araki, Niigata (JP); Koji Sueoka, Okayama (JP); Kozo Nakamura, Okayama (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 133 days.

(21) Appl. No.: 16/305,680

(22) PCT Filed: Mar. 23, 2017

(86) PCT No.: PCT/JP2017/011721

§ 371 (c)(1),
(2) Date: Nov. 29, 2018

(87) PCT Pub. No.: WO2017/208582

PCT Pub. Date: Dec. 7, 2017

(65) Prior Publication Data

US 2020/0181802 A1    Jun. 11, 2020

(30) Foreign Application Priority Data

Jun. 1, 2016    (JP) .............................. JP2016-109845

(51) Int. Cl.
*H01L 21/00* (2006.01)
*C30B 33/02* (2006.01)
(Continued)

(52) U.S. Cl.
CPC .......... *C30B 33/02* (2013.01); *H01L 21/3221* (2013.01); *C30B 29/06* (2013.01)

(58) Field of Classification Search
CPC ...... C30B 33/02; C30B 29/06; H01L 21/3221
See application file for complete search history.

(56) References Cited

U.S. PATENT DOCUMENTS 5,385,115 A    1/1995    Tomioka et al.
6,436,846 B1    8/2002    Tews et al.
(Continued)

FOREIGN PATENT DOCUMENTS

JP    04-130732    5/1992
JP    2000-091259    3/2000
(Continued)

OTHER PUBLICATIONS

International Search Report dated Jun. 20, 2017 in International (PCT) Patent Application No. PCT/JP2017/011721.
(Continued)

*Primary Examiner* — Mounir S Amer
*Assistant Examiner* — Alexander Belousov
(74) *Attorney, Agent, or Firm* — Wenderoth, Lind & Ponack, L.L.P.

(57) ABSTRACT

A processing temperature $T_S$ by a rapid thermal processing furnace is 1250° C. or more and 1350° C. or less, and a cooling rate $R_d$ from the processing temperature is in a range of 20° C./s or more and 150° C./s or less, and thermal processing is performed by adjusting the processing temperature $T_S$ and the cooling rate $R_d$ within a range between the upper limit $P=0.00207T_S \cdot R_d - 2.52R_d + 13.3$ (Formula (A)) and the lower limit $P=0.000548T_S \cdot R_d - 0.605R_d - 0.511$ (Formula (B)) of an oxygen partial pressure P in a thermal processing atmosphere.

4 Claims, 16 Drawing Sheets

(51) Int. Cl.
*H01L 21/322* (2006.01)
*C30B 29/06* (2006.01)

(56) References Cited

U.S. PATENT DOCUMENTS

| | | | |
|---|---|---|---|
| 2003/0196587 A1* | 10/2003 | McCallum | C30B 29/06 117/13 |
| 2005/0005841 A1 | 1/2005 | Falster et al. | |
| 2006/0075960 A1 | 4/2006 | Borgini et al. | |
| 2007/0252239 A1 | 11/2007 | Maeda et al. | |
| 2010/0004775 A1* | 1/2010 | Lin | G05B 19/41875 700/110 |
| 2010/0038757 A1 | 2/2010 | Isogai et al. | |
| 2011/0042791 A1 | 2/2011 | Schulze et al. | |

FOREIGN PATENT DOCUMENTS

| | | |
|---|---|---|
| JP | 2005-311200 | 11/2005 |
| JP | 2007-534579 | 11/2007 |
| JP | 2009-016864 | 1/2009 |
| JP | 2009-524227 | 6/2009 |
| JP | 2010-212333 | 9/2010 |
| JP | 2011-171414 | 9/2011 |

OTHER PUBLICATIONS

International Preliminary Report on Patentability dated Dec. 4, 2018 in International (PCT) Patent Application PCT/JP2017/011721.

Hallberg et al., "Enhanced oxygen precipitation in electron irradiated silicon", Journal of Applied Physics, vol. 72., No. 11, pp. 5130-5138, 1992.

Falster et al., "On the Properties of the Intrinsic Point Defects in Silicone: A Perspectvie from Crystal Growth and Wafer Processing", Phys. Status Solidi B, vol. 222, pp. 219-244, 2000.

Akatsuka et al., "Effect of Rapid Thermal Annealing on Oxygen Precipitation Behavior in Silicon Wafers", Jpn, J. Appl. Phys., vol. 40, pp. 3055-3062, 2001.

* cited by examiner

Processing temperature 1350 ℃
Oxygen partial pressure 100 %

Cooling rate 120 ℃/S

Processing temperature 1350 ℃
Oxygen partial pressure 100 %

Cooling rate 50 ℃/S

Processing temperature 1350 ℃
Oxygen partial pressure 100 %

Cooling rate 25 ℃/S

Cooling rate 25 ℃/S
Oxygen partial pressure 0 %

Processing temperature 1300 ℃

Cooling rate 25 ℃/S
Oxygen partial pressure 0 %

Processing temperature 1275 ℃

Cooling rate 25 ℃/S
Oxygen partial pressure 0 %

Processing temperature 1250 ℃

Cooling rate 120 ℃/S
Oxygen partial pressure 0 %

Processing temperature 1300 ℃

Cooling rate 120 ℃/S
Oxygen partial pressure 0 %

Processing temperature 1275 ℃

Cooling rate 120 ℃/S
Oxygen partial pressure 0 %

Processing temperature 1250 ℃

THERMAL PROCESSING METHOD FOR SILICON WAFER

TECHNICAL FIELD

The present invention relates to a thermal processing method for a silicon wafer having a surface layer in which a semiconductor device is formed.

BACKGROUND ART

With an increasing degree of integration and increasing performance of today's semiconductor devices, higher quality is required for silicon wafers (hereinafter simply referred to as "wafers") used as substrates for semiconductor devices.

Specifically, it is required that a denuded zone (hereinafter referred to as the "DZ layer"), which forms the surface layer of the wafer in which semiconductor devices are formed, is completely free of oxygen precipitates which are compounds of silicon and oxygen that dissolves into the silicon crystal during growth of the silicon crystal from a crucible for storing silicon melt, and also completely free of void defects which are aggregates of vacancies introduced into the crystal during growth of the crystal. This is because oxygen precipitates could act as leak current sources and deteriorate the electrical properties of the semiconductor devices, while void defects could form dents in the surface of the wafer which could result in the breakage of wiring formed on the surface.

On the other hand, in a bulk layer, disposed deeper than the DZ layer, it is required that oxygen precipitates exist at a density higher than a predetermined level. This is because oxygen precipitates in the bulk layer act as a gettering source which captures heavy metals attached to a wafer surface during processing to improve electrical characteristics of a device, and also act as a fixation source to fix the movement of dislocation that causes plastic deformation during thermal processing of the wafer, thereby improving the mechanical strength of the wafer.

The wafer depth direction distribution of the density of oxygen precipitates greatly depends on the wafer depth direction distribution of point defects (especially vacancies) induced by rapid thermal processing (hereinafter abbreviated as "RTP") applied to the wafer at high temperatures. For example, in JP 2009-16864A, RTP is performed on a wafer sliced from a crystal grown by the Czochralski method in an atmosphere of argon or hydrogen (see paragraph 0037 of JP 2009-16864A). By performing RTP, it is possible to form a DZ layer having no oxygen precipitates in the surface layer of the wafer and oxygen precipitates at sufficient density in the bulk region (see FIGS. 7 and 8 of JP 2009-16864A).

In JP 2009-16864A, as is apparent from the photographs of FIGS. 12 to 21, evaluation of oxygen precipitates is performed by using an infrared scattering tomography apparatus, and based on the evaluation result, the width of the DZ layer, where no oxygen precipitates exist, is defined. However, an infrared scattering tomography apparatus can detect only oxygen precipitates having sizes of about 25 nm or more, and it is difficult to detect any smaller oxygen precipitates. For example, it has been found that, in an image sensor device, oxygen precipitates equal to or smaller in size than the lower detection limit of an infrared scattering tomography apparatus may cause pixel defects of the image sensor called "white spot defects", and suppression of minute oxygen precipitates undetectable by an infrared scattering tomography apparatus is becoming more important.

It has been found that density of oxygen precipitates is closely related to the density of vacancy-oxygen complexes (hereinafter abbreviated as "VOx") introduced into the wafer by RTP. Specifically, as indicated by solid line in FIG. 1A, in the DZ layer, by setting the VOx density to less than $1.0 \times 10^{12}/cm^3$, formation of oxygen precipitates that may adversely affect the device characteristics is reliably suppressed, and in the bulk layer, by setting the VOx density to $5.0 \times 10^{12}/cm^3$ or more, it is possible to introduce oxygen precipitates having a necessary and sufficient density for gettering heavy metals.

However, the VOx density is difficult to measure unless a special method requiring a high cost such as DLTS measurement after platinum diffusion is employed, and it is difficult to control the density in the wafer depth direction. Therefore, in a conventional wafer, as shown in FIG. 1B, a region (indicated as "NG" in the figure) of a VOx density of $1.0 \times 10^{12}/cm^3$ or more at which minute oxygen precipitates may precipitate may be formed in the DZ layer, and there is a fear that the device characteristics are deteriorated.

Moreover, in order to obtain optimal thermal processing conditions by individually changing a plurality of thermal processing parameters (processing temperature, cooling rate, oxygen partial pressure), it is necessary to conduct an experiment involving a large number of trials and errors, and this has been a serious problem also in terms of cost.

Accordingly, an object of the present invention is to conveniently determine thermal processing conditions capable of simultaneously achieving the integrity of a denuded zone (DZ layer) and the high gettering ability in the bulk layer.

SUMMARY OF THE INVENTION

In order to achieve this object, the present invention provides a thermal processing method for a silicon wafer, comprising subjecting the silicon wafer to thermal processing using a rapid thermal processing furnace at a processing temperature $T_S$ of 1250° C. or more and 1350° C. or less, wherein the thermal processing includes cooling from the processing temperature $T_S$ at a cooling rate $R_d$ in a range of 20° C./s or more and 150° C./s or less, and wherein the thermal processing is performed in a thermal processing atmosphere gas having an oxygen partial pressure P within a range between an upper limit represented by the following Formula (A) and a lower limit represented by the following Formula (B).

[Math. 1]

$$P = 0.00207 T_S \cdot R_d - 2.52 R_d + 13.3 \quad \text{(A)}$$

[Math. 2]

$$P = 0.000548 T_S \cdot R_d - 0.605 R_d - 0.511 \quad \text{(B)}$$

As described above, by associating the three parameters, i.e., the oxygen partial pressure P, the processing temperature $T_S$, and the cooling rate $R_d$, for example, by determining the oxygen partial pressure P and the processing temperature $T_S$ among the three parameters to predetermined values and determining the cooling rate $R_d$ within a predetermined range by the Formulae (A) and (B), it is possible to easily determine thermal processing conditions for forming a DZ layer having a VOx density of less than $1.0 \times 10^{12}/cm^3$ and a bulk layer having a VOx density of $5.0 \times 10^{12}/cm^3$ or more without performing trial experiments. Between the DZ layer and the bulk layer, an intermediate layer in which the VOx density gradually increases from $1.0 \times 10^{12}/cm^3$ to $5.0 \times 10^{12}/cm^3$ from the wafer surface to the thickness center is formed.

The present invention also provides a thermal processing method for a silicon wafer, comprising: a step of determining, by a point defect simulation for predicting behavior of vacancies and interstitial silicon atoms in the silicon wafer during thermal processing, combinations each comprising a predetermined value of a processing temperature $T_S$, a predetermined value of a cooling rate $R_d$, and a predetermined value of an oxygen partial pressure P, and each determining a value of a width $W_{DZ}$ of a denuded zone; a step of determining, based on the combinations, a regression equation relating the width $W_{DZ}$ of the denuded zone to the processing temperature $T_S$, the cooling rate $R_d$, and the oxygen partial pressure P; and a step of determining a combination of specific value of the processing temperature $T_S$, a specific value of the cooling rate $R_d$, and a specific value of the oxygen partial pressure P for obtaining a denuded zone with a desired width by using the regression equation.

A required width $W_{DZ}$ of a DZ layer varies depending on the type of a semiconductor device formed on a wafer. According to the thermal processing method, by determining a regression equation in advance by a point defect simulation, it is possible to easily form a DZ layer having a desired width $W_{DZ}$ by a combination of three parameters a processing temperature $T_S$, a cooling rate $R_d$, and an oxygen partial pressure P corresponding to the type of a semiconductor device. The point defect simulation will be described in detail below.

In the above-described configuration, it is further preferable to configure that the regression equation is represented by the following Formula (C), and the width $W_{DZ}$ of the denuded zone is made predictable within an error range of ±5 μm.

[Math. 3]

$$w_{DZ} = -0.129R_d + 15.6P - 0.0109T_S \cdot R_d + 34.2P/R_d - 7.95 \quad (C)$$

By using Formula (C) as the regression equation, it is possible to determine RTP conditions for obtaining a desired DZ layer width $W_{DZ}$ with favorable accuracy and convenience, and it is possible to improve the quality of a wafer and to greatly reduce the manufacturing cost.

The above-described configurations are preferably configured to include: a step of determining, by a point defect simulation for predicting a behavior of vacancies and interstitial silicon atoms in a silicon wafer during thermal processing, combinations each comprising a predetermined value of a processing temperature $T_S$, a predetermined value of a cooling rate $R_d$, and a predetermined value of an oxygen partial pressure P, and each determining a value of a width $W_{Inter}$ of an intermediate layer is obtained; a step of determining, based on the combinations, a regression equation relating the width $W_{Inter}$ of the intermediate layer to the processing temperature $T_S$, the cooling rate $R_d$, and the oxygen partial pressure P; and a step of determining a combination of a specific value of the processing temperature $T_S$, a specific value of the cooling rate $R_d$, and a specific value of the oxygen partial pressure P for obtaining an intermediate layer with a desired width by using the regression equation.

The intermediate layer is a region in which the VOx density gradually increases from the DZ layer to the bulk layer as described above. During a device manufacturing process, a heavy metal attached to the surface of a wafer diffuses from a DZ layer to a bulk layer through the intermediate layer, gettered by an oxygen precipitate precipitated in the bulk layer, and removed from the DZ layer (device active region). In order to efficiently getter a heavy metal, it is basically preferable to make the VOx density in the intermediate layer steeply rise from the DZ layer side to the bulk layer side to minimize the width $W_{Inter}$ of the intermediate layer. As described above, by determining a combination of a processing temperature $T_S$, a cooling rate $R_d$, and an oxygen partial pressure P by which a DZ layer and an intermediate layer having a desired width are obtained based on the result of a point defect simulation, it is possible to greatly reduce the number of steps required for these determinations and to reduce the manufacturing cost.

In configurations in which the width of an intermediate layer is determined by a regression equation as described above, it is further preferable that the regression equation is represented by the following Formula (D), and the width $W_{Inter}$ of the intermediate layer is made predictable within an error range of ±10 μm.

[Math. 4]

$$W_{Inter} = -0.141T_S - 6.74P + 0.00456T_S \cdot R_d + 62.7P/R_d + 243.1 \quad (D)$$

By using Formula (D) as the regression equation, it is possible to determine RTP conditions for obtaining a desired intermediate layer width $W_{Inter}$ with favorable accuracy and convenience, and it is possible to improve the quality of a wafer and to greatly reduce the manufacturing cost.

Advantageous Effects of the Invention

In the present invention, a thermal processing method for a silicon wafer, wherein a processing temperature $T_S$ by a rapid thermal processing device is 1250° C. or more and 1350° C. or less, and a cooling rate $R_d$ from the processing temperature $T_S$ is in a range of 20° C./s or more and 150° C./s or less, an upper limit and a lower limit of an oxygen partial pressure P in a thermal processing atmosphere gas are represented by predetermined formulae, and thermal processing is performed within a range between the upper limit and the lower limit, is configured.

As described above, by relating three parameters an oxygen partial pressure P, a processing temperature $T_S$, and a cooling rate $R_d$, determining each parameter in such a manner that the oxygen partial pressure P falls within a range between the upper limit and the lower limit, and performing thermal processing, it is possible to easily form a bulk layer having a high gettering ability for heavy metals while forming a DZ layer with high integrity without repeating many trial experiments.

EMBODIMENTS

A thermal processing method for a silicon wafer (wafer) according to the present invention is a method for performing rapid thermal processing (RTP) by using a ramp annealing furnace capable of rapidly increasing and decreasing temperature in an oxygen atmosphere (oxygen partial pressure is in the range of 1% or more and 100% or less) and for introducing vacancy oxygen complexes (VOx), which are complexes of vacancies and oxygen, into the wafer. As the wafer for thermal processing, a wafer sliced from an ingot grown by the Czochralski method (hereinafter referred to as CZ method) and mirror polished on both sides thereof is used.

Figure 1A:
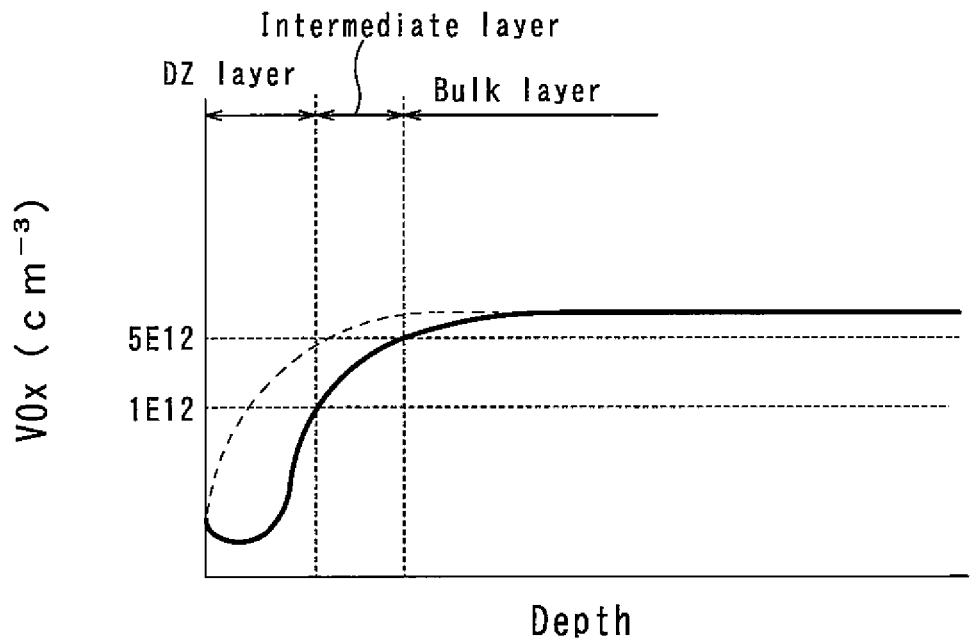
FIG. 1A is a conceptual diagram showing a wafer depth direction distribution of the VOx density of a wafer capable of forming a favorable DZ layer and bulk layer.
Figure 1B:
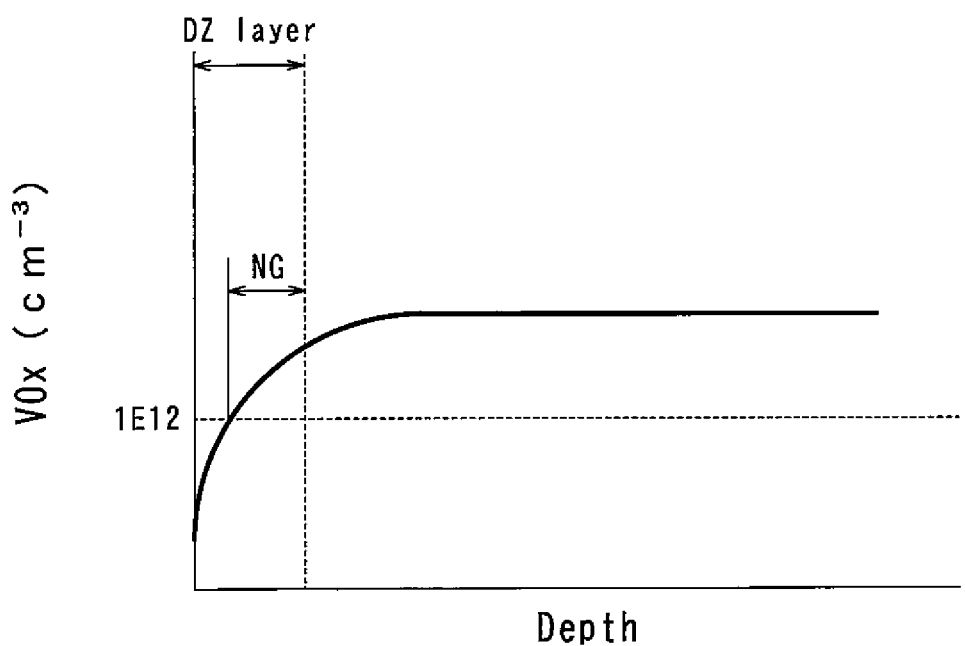
FIG. 1B is a conceptual diagram showing a wafer depth direction distribution of the VOx density of a wafer in which oxygen precipitates may be formed in a DZ layer.
Figure 2:
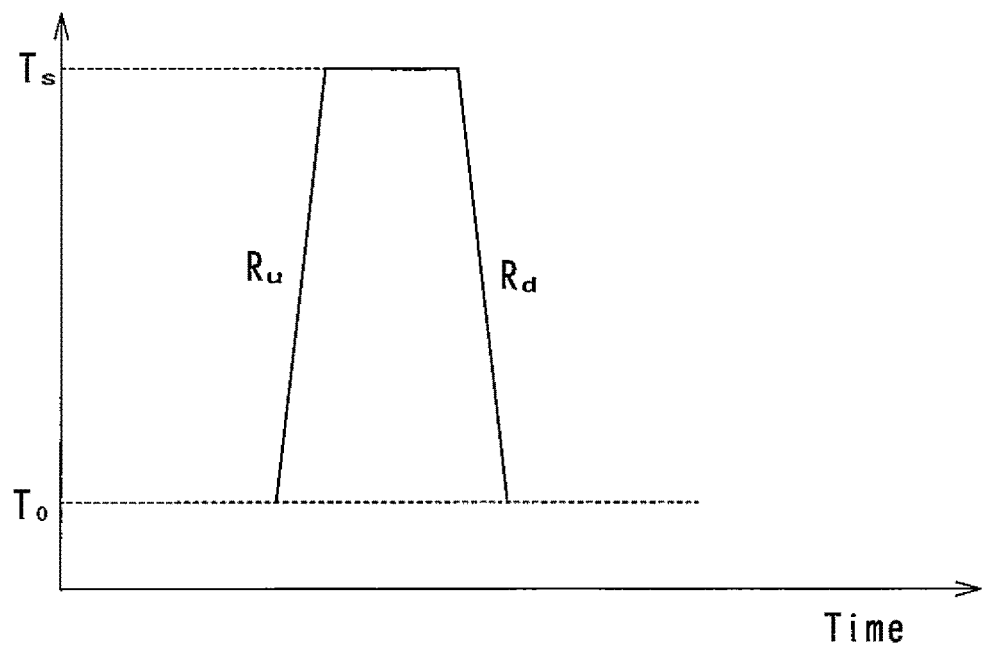
FIG. 2 is a diagram showing an example of a thermal processing sequence employed in a thermal processing method of a silicon wafer in the present invention.
Figure 3A:
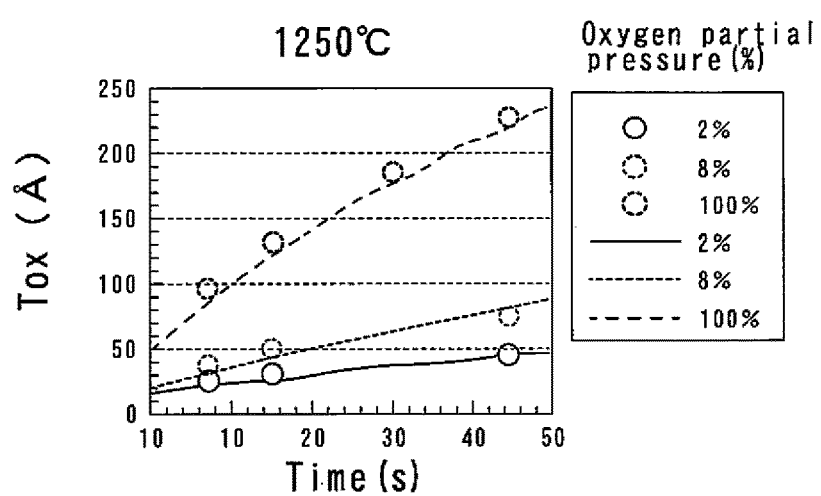
FIG. 3A is a diagram showing the processing time dependency of the thickness of an oxide film formed when a silicon wafer is thermally processed in oxygen atmospheres at a processing temperature of 1250° C.
Figure 3B:
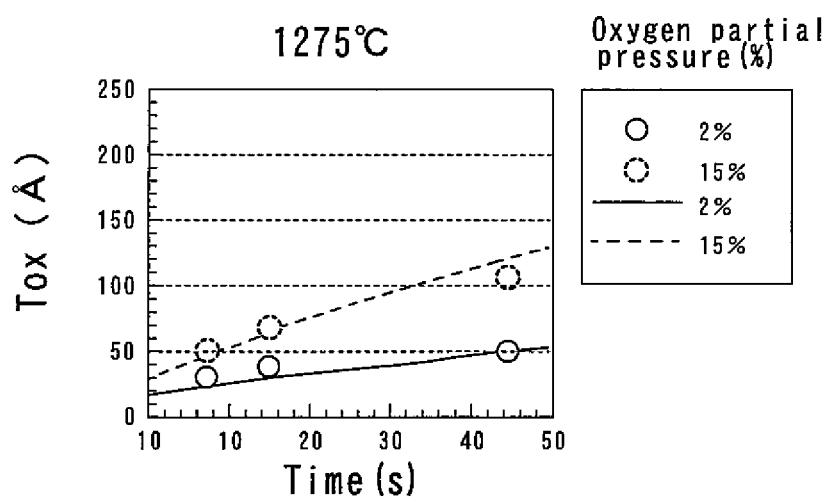
FIG. 3B is a diagram showing the processing time dependency of the thickness of an oxide film formed when a silicon wafer is thermally processed in oxygen atmospheres at a processing temperature of 1275° C.
Figure 3C:
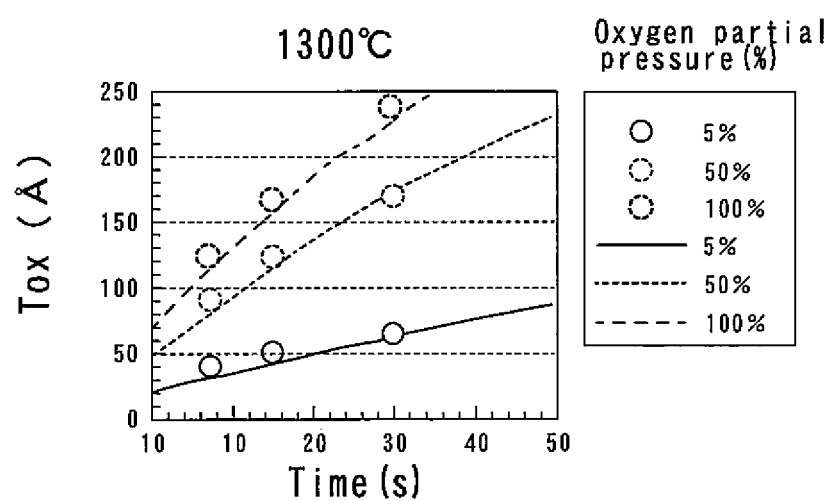
FIG. 3C is a diagram showing the processing time dependency of the thickness of an oxide film formed when a silicon wafer is thermally processed in oxygen atmospheres at a processing temperature of 1300° C.
Figure 3D:
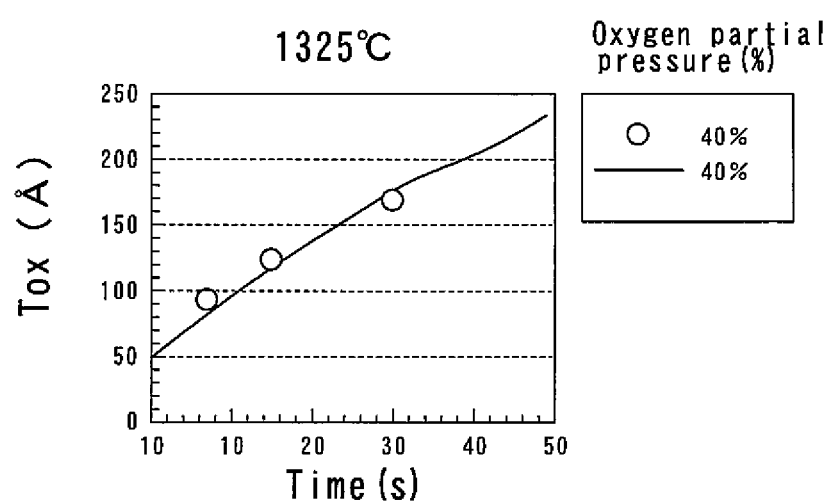
FIG. 3D is a diagram showing the processing time dependency of the thickness of an oxide film formed when a silicon wafer is thermally processed in oxygen atmospheres at a processing temperature of 1325° C.

As the RTP thermal processing, for example, a sequence shown in FIG. 2 is employed. In this sequence, the temperature is raised at a predetermined ramp up rate $R_u$ from a predetermined temperature $T_0$ (for example, 700° C.) to a processing temperature $T_S$, and is held for a predetermined time (for example, 15 seconds) at the processing temperature $T_S$. Then, the temperature is decreased from the processing temperature $T_S$ to the predetermined temperature $T_0$ at a predetermined cooling rate $R_d$.

The VOx density distribution in the wafer depth direction was calculated using a point defect simulation. The point defect simulation is a model of a series of physical phenomena comprising formation of an oxide film on the surface of the wafer by thermal processing in an oxygen atmosphere, generation of interstitial silicon atoms at the interface between the oxide film and the silicon crystal, diffusion of the interstitial silicon atoms into the wafer, and pair annihilation of the interstitial silicon atoms and vacancies. In the following, the point defect simulation will be described in detail, and a method of determining the upper and lower limits of the oxygen partial pressure or predicting the widths of the DZ layer and the intermediate layer by regression analysis from the results of this simulation will be described.

(1) Regarding Point Defect Simulation (a) Formation of Oxide Film

When RTP is performed in an oxygen atmosphere, an oxide film is formed as described above, and interstitial silicon atoms are injected into the wafer from the interface between the oxide film and the silicon crystal. It is known that the ratio of the concentration of interstitial silicon atoms generated at the interface between the oxide film and the silicon crystal to the thermal equilibrium concentration thereof in the silicon crystal, that is, the degree of supersaturation of interstitial silicon atoms, is a factor which greatly influences the accuracy of point defect simulation, and is known to be determined by the growth rate of the oxide film. Therefore, the growth rate of the oxide film during RTP in an oxygen atmosphere will be examined in detail.

Growth of the oxide film is represented by the Deal-Grove equation (B. Deal, J. *Electrochem. Soc.* 125 (1978) 576) shown in Formula (1).

[Math. 5]

$$X_0^2 + AX_0 = B(t-t_0) \quad (1)$$

Here, $X_0$ is the thickness of the oxide film, t is the time, and $t_0$ is the time expressing the initial value of the thickness of the oxide film. When the oxide film is sufficiently thick, Formula (1) is approximated as the following Formula (1'), and the thickness $X_0$ of the oxide film becomes a parabolic function proportional to the root of time.

[Math. 6]

$$X_2^0 = Bt \quad (1')$$

Here, the following Formula (2) is obtained by differentiating Formula (1).

[Math. 7]

$$\left(\frac{dX_0}{dt}\right)^{-1} = \frac{1}{B/A} + \frac{2X_0}{B} = \frac{1}{K_L} + \frac{2X_0}{K_P} \quad (2)$$

Here, B/A is called Linear rate constant ($K_L$), and B is called Parabolic rate constant ($K_P$). B/A corresponds to a reaction rate at the oxide film-wafer interface, and B relates to the thickness of the oxide film, and is a term corresponding to a diffusion effect in the oxide film. Although, inherently, Formula (2) is an equation to be applied to the entire oxidation process including the process of increasing the oxide film thickness, Kotani et al. showed that Formula (2) itself is usable also for the initial process of oxidation in which only a thin oxide film is formed such as during RTP by replacing the values of $K_L$ and $K_P$ with values for RTP (Y. Kotani and Y. Omura, *Jpn. J. Appl. Phys.* 39 (2000) 4549).

Since data during RTP in an oxygen atmosphere obtained by Kotani et al. is up to 1100° C., for the temperature region higher than 1100° C., thickness data of the oxide film when changing the processing temperature, the processing time, and the oxygen partial pressure of RTP was obtained by an experiment. Plots shown in FIGS. 3A to 3D are data obtained by such an experiment. The oxidation rate was calculated from these data and $K_L$ and $K_P$ were determined as a function of temperature and oxygen partial pressure as shown in the following Formulae (3) and (4).

[Math. 8]

$$K_L = 629 P^{0.6} \exp(-0.5437 \text{ eV}/kT)(A/s) \quad (3)$$

[Math. 9]

$$K_P = 1.01 \times 10^{11} P^{0.6} \exp(-2.347 \text{ eV}/kT)(A^2/s) \quad (4)$$

Here, P represents the oxygen partial pressure during RTP in an oxygen atmosphere, and T represents the absolute temperature. Calculated values of the thickness of the oxide film obtained from Formulae (2), (3), and (4) are indicated by lines in FIGS. 3A to 3D. These calculated values and experimental data are in good agreement with each other, indicating that the oxidation rate at any processing temperature and oxygen partial pressure can be accurately estimated from the values of $K_L$ and $K_P$ determined by the processing temperature and oxygen partial pressure.

(b) Calculation of VOx Density

The density distribution of VOx formed in the wafer was calculated by the following procedure.

The growth rate of the oxide film formed on the wafer surface can be expressed by the following Formula (2') from Formula (2).

[Math. 10]

$$\frac{dX_0}{dt} = \frac{1}{1/K_L + 2X_0/K_P} \quad (2')$$

The thickness of the oxide film at any time during the RTP process was determined by integrating Formula (2') over the entire process of RTP while increasing the temperature, while holding the processing temperature, and while decreasing the temperature. In this integration, the film thickness of a natural oxide film was defined as the initial thickness of the oxide film. The values of Formulae (3) and (4) were employed as values of $K_L$ and $K_P$ in Formula (2'). From these, the growth rate of the oxide film at an arbitrary time was obtained using Formula (2'). Using the obtained growth rate of the oxide film, the supersaturation degree of interstitial silicon atoms at the interface between the oxide film and the wafer was obtained by the following Formula (5) proposed by Taniguchi et al. (K. Taniguchi et al., *J. Appl. Phys.* 65 (1989) 2723).

[Math. 11]

$$\frac{C_I}{C_I^{eq}} = \frac{A1(dX_0/dt) + A2}{(dX_0/dt)^{0.5} + A2} \quad (5)$$

Here, $C_I$ is the concentration of the interstitial silicon atoms, $C_I^{eq}$ is the thermal equilibrium concentration of the interstitial silicon atoms, and A1 and A2 are parameters related to the oxidation phenomenon. A1 and A2 in a dry oxygen atmosphere were determined to fit to the relationship between the supersaturation degree of interstitial silicon atoms and the growth rate of the oxide film determined experimentally by Dunhum (S. T. Dunhum, *J. Appl. Phys.* 71 (1992) 685). The density of interstitial silicon atoms generated at the oxidation interface is obtained by multiplying the degree of supersaturation of interstitial silicon atoms obtained from Formula (5) by the thermal equilibrium concentration of interstitial silicon atoms described below.

The vacancy concentration $C_V$ at the interface between the oxide film and the silicon crystal was determined from the following Formula (6) representing a local equilibrium relationship assuming that the relationship of generation/pair annihilation of vacancies V and interstitial silicon atoms I is in a steady state balance.

[Math. 12]

$$C_V C_I = C_V^{eq} C_I^{eq} \qquad (6)$$

Here, $C_V$ is the concentration of vacancies, and $C_V^{eq}$ is the thermal equilibrium concentration of vacancies. As can be seen from Formula (6), the $C_V$ at the oxide film-Si crystal interface is determined by the $C_I$ at this interface. The point defect concentration in the wafer is determined by solving the following Formulae (7) and (8) with the $C_V$ and the $C_I$ at the interface as boundary conditions.

[Math. 13]

$$\frac{\partial C_V}{\partial t} = D_V \frac{\partial^2 C_V}{\partial Z^2} - K_{IV}(C_V C_I - C_V^{eq} C_I^{eq}) \qquad (7)$$

[Math. 14]

$$\frac{\partial C_I}{\partial t} = D_I \frac{\partial^2 C_I}{\partial Z^2} - K_{IV}(C_V C_I - C_V^{eq} C_I^{eq}) \qquad (8)$$

Here, $D_V$ is the diffusion coefficient of vacancies, $D_I$ is the diffusion coefficient of the interstitial silicon atoms, and $K_{IV}$ is the reaction constant of the pair annihilation reaction of vacancies and interstitial silicon atoms. This reaction constant K can be represented by the following Formula (9).

[Math. 15]

$$K_{IV} = 4\pi a_c (D_V + D_I) \exp(-\Delta G_{IV}/kT) \qquad (9)$$

Here, $a_c$ is the critical distance at which the vacancies V and the interstitial silicon atoms I cause pair annihilation, and $\Delta G_{IV}$ is the barrier energy of annihilation. In this calculation, the same numerical values as used by Kissinger et al., or $a_c$=0.543 nm and $\Delta G_{IV}$=0 were employed (G. Kissinger et al., *J. Electrochem. Soc.* 154 (2007) H4547). For the diffusion coefficient and thermal equilibrium concentrations of vacancies and interstitial silicon atoms, the values used by Nakamura et al. shown in Formulae (10)-(13) were employed (K. Nakamura et al., in *Semiconductor Silicon*, PV2002-2, p. 554, The Electrochemical Society Proceedings Series, Pennington, N.J. (2002)).

[Math. 16]

$$D_V = 3.5 \times 10^{-4} \exp(-0.3 \text{ eV}/kT)(\text{cm}^2/\text{s}) \qquad (10)$$

[Math. 17]

$$D_I = 2.45 \times 10^{-1} \exp(-0.9 \text{ eV}/kT)(\text{cm}^2/\text{s}) \qquad (11)$$

[Math. 18]

$$C_V^{eq} = 3.85 \times 10^{26} \exp(-3.94 \text{ eV}/kT)(\text{cm}^{-3}) \qquad (12)$$

[Math. 19]

$$C_I^{eq} = 6.12 \times 10^{26} \exp(-4.05 \text{ eV}/kT)(\text{cm}^{-3}) \qquad (13)$$

Next, handling of oxygen atoms and nitrogen atoms in a silicon single crystal will be described. In a silicon single crystal manufactured by the CZ method, a quartz crucible holding a silicon melt at the time of pulling melts into a silicon melt, and oxygen atoms are taken in. Such oxygen atoms are transported to just below the growth interface of the silicon single crystal due to convection of the melt and diffusion in the melt and is mixed into the silicon single crystal from the growth interface. Nitrogen atoms are intentionally added to the silicon melt as a silicon nitride film or the like in order to suppress the size of void defects generated in the silicon single crystal. Normally, these atoms diffuse in the silicon single crystal based on the following Formulae (14) and (15).

[Math. 20]

$$\frac{\partial C_O}{\partial t} = D_O \frac{\partial^2 C_O}{\partial Z^2} \qquad (14)$$

[Math. 21]

$$\frac{\partial C_N}{\partial t} = D_N \frac{\partial^2 C_N}{\partial Z^2} \qquad (15)$$

Here, $C_O$ is the concentration of oxygen atoms and $C_N$ is the concentration of nitrogen atoms. $D_O$ is the diffusion coefficient of oxygen, and $D_N$ is the diffusion coefficient of nitrogen, which are given by the following Formulae (16) and (17), respectively, by Mikkelesen et al. (J. C. Mikkelsen, Jr., in *Oxygen, Carbon, Hydrogen and Nitrogen in Crystalline Silicon*, ed. J. C. Mikkelsen, Jr. et al. (MRS, Princeton, N.J., 1986) 19), and Y. Itoh et al. (Y. Itoh, T Abe, *Appl Phys. Lett.*) vol53 (1988) 39).

[Math. 22]

$$D_O = 0.13 \exp(-2.53 \text{ eV}/kT)(\text{cm}^2/\text{s}) \qquad (16)$$

[Math. 23]

$$D_N = 2.7 \times 10^3 \exp(-2.8 \text{ eV}/kT)(\text{cm}^2/\text{s}) \qquad (17)$$

It is assumed that the concentrations of oxygen and nitrogen atoms at the interface between the oxide film and silicon crystal have thermal equilibrium concentrations represented by the following Formulae (18) and (19), respectively.

[Math. 24]

$$C_O^{eq} = 2.0 \times 10^{21} \exp(-1.03 \text{ eV/kT})(\text{cm}^{-3}) \qquad (18)$$

[Math. 25]

$$C_N^{eq} = 4.5 \times 10^{15} \exp\left(-2.15 \text{ eV}/k\left(\frac{1}{T} - \frac{1}{1685}\right)\right)(\text{cm}^{-3}) \qquad (19)$$

Here, $C_O^{eq}$ is the thermal equilibrium concentration of oxygen and $C_N^{eq}$ is the thermal equilibrium concentration of nitrogen. As the thermal equilibrium concentration of nitrogen atoms, an energy value of 2.15 eV employed by Voronkov et al. was used (V. V. Voronkov and R. Falster, *J. Electrochem. Soc.* 149 (2002) G167).

Nitrogen atoms and vacancies in the silicon single crystal easily form complexes (hereinafter referred to as NV complexes) during the cooling process. This density is given by the following Formula (20) according to Voronkov et al.

[Math. 26]

$$[NV]=C_V/C_V^{eq}[N_2]^{1/2}\exp(-E_{neV}/kT)(\text{cm}^{-3}) \quad (20)$$

Here, the value in [ ] in Formula (20) represents the atomic fraction, and $[NV]=C_{NV}/\rho$, and $[N_2]=C_{N2}/\rho$. $\rho$ represents the atomic density of the silicon single crystal, and $\rho=5\times10^{22}/\text{Cm}^3$. In this calculation, it is assumed that the NV complexes do not diffuse.

A steady state balance is always established between the concentrations of vacancies V, nitrogen $N_2$, and NV complexes in the silicon single crystal. In other words, assuming that the total vacancy concentration is $C_V^T$ and its thermal equilibrium concentration is $C_V^{T\cdot eq}$, relationships of the following Formulae (21) and (22) are established.

[Math. 27]

$$C_V^T = C_V + C_{NV} \quad (21)$$

[Math. 28]

$$C_V^{T\cdot eq} = C_V^{eq} + C_{NV}^{eq} \quad (22)$$

Here, the vacancy concentration $C_V$ and the NV complex concentration $C_{NV}$ are determined from the total vacancy concentration $C_V^T$ in each element space by using the following Formulae (23) and (24).

[Math. 29]

$$C_V = (C_V^{eq}/C_V^{T\cdot eq})C_V^T \quad (23)$$

[Math. 30]

$$C_{NV} = (C_V^{eq}/C_V^{T\cdot eq})C_V^T \quad (24)$$

Here, when Formula (23) is modified, the following Formula (25) is obtained.

[Math. 31]

$$C_V/C_V^{eq} = C_V^T/C_V^{T\cdot eq} \quad (25)$$

By substituting Formula (25) into Formula (24), the following Formula (26) is obtained.

[Math. 32]

$$C_{NV} = C_{NV}^{eq}(C_V/C_V^{eq}) \quad (26)$$

Since $C_{NV}^{eq}$ is represented by the following Formula (27), Formulae (20) and (26) coincide.

[Math. 33]

$$C_{NV}^{eq} = \rho(C_{N2}/\rho)^{1/2}\exp(-E_n/kT) \quad (27)$$

The Formula (27) represents the thermal equilibrium concentration of the NV complexes when the vacancy concentration is the thermal equilibrium concentration.

In a point defect simulation after RTP in an oxygen atmosphere, first, as the initial state, thermal equilibrium concentrations of vacancies and interstitial silicon atoms corresponding to the initial temperature of RTP are given over the entire depth direction of the wafer. Then, the thermal equilibrium concentrations given by Formulae (5) and (6) are changed as boundary conditions between the oxide film and the silicon crystal, corresponding to each temperature change while the ramp up, while the duration at maximum temperature, and while the cooling in RTP. Along with this, the wafer depth direction distribution of vacancies and interstitial silicon atoms is derived by numerical calculation by using Formulae (7)-(9).

As in the calculation of vacancies and interstitial silicon atoms, firstly, as an initial state, the concentration of oxygen atoms and the concentration of nitrogen atoms corresponding to the initial temperature of RTP are given over the entire depth direction of the wafer. Then, the thermal equilibrium concentrations given in Formulae (18) and (19) are changed as boundary conditions of the concentrations of oxygen atoms and nitrogen atoms between the oxide film and the silicon crystal corresponding to each temperature change while the ramp up, while the duration at maximum temperature, and while the cooling in RTP. Along with this, the wafer depth direction distribution of oxygen and nitrogen is derived by numerical calculation using Formulae (14)-(17).

Regarding the interaction between nitrogen atoms and vacancies, the concentration ([NV]) of the complexes of nitrogen and vacancies is calculated using Formulae (20)-(27). In calculating the vacancy concentration, considering that the nitrogen-vacancy complexes (NV) rapidly diverge (NV→N+V) due to the decrease of independently present single vacancies (V), and becomes a source of single vacancies, the total vacancy concentration was calculated as the sum ([V]+[NV]) of the single vacancy concentration ([V]) and the nitrogen-vacancy complex concentration ([NV]).

During the cooling step of RTP, more specifically at 1000° C. or lower, it was assumed that the total vacancies rapidly react with oxygen atoms present in the wafer at a concentration several orders of magnitude higher than the vacancies, and change to VOx's which are most stable at a low temperature. In other words, in this point defect simulation, it was assumed that the total vacancy concentration and the VOx density correspond one-to-one.

Figure 4:
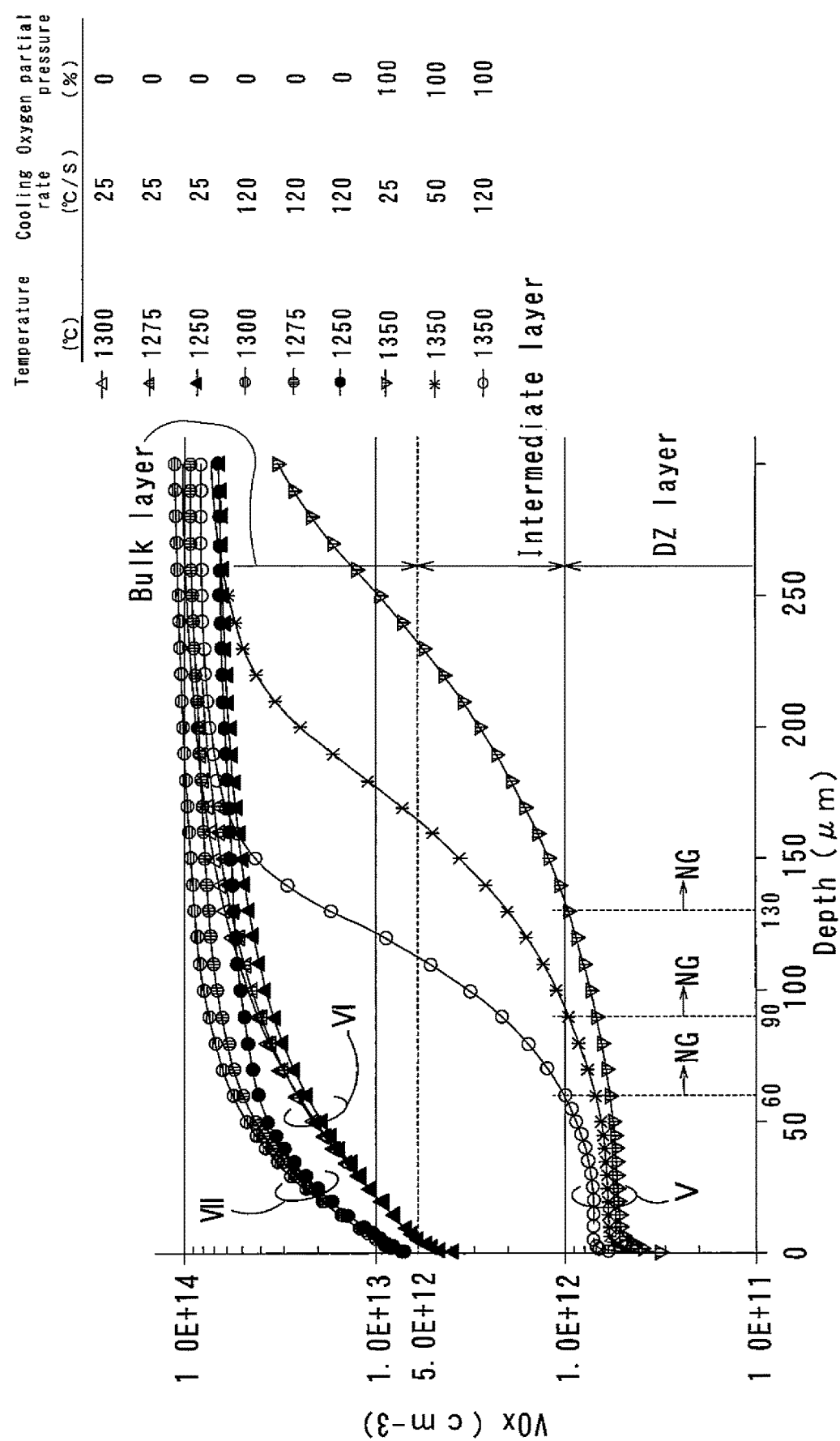
FIG. 4 is a diagram showing simulation results of the VOx density.

FIG. 4 shows an example of the simulation result of the wafer depth direction distribution of VOx's when the processing temperature, the cooling rate, and the oxygen partial pressure during RTP were varied. The region where the VOx density is less than $1.0\times10^{12}/\text{cm}^3$ corresponds to the DZ layer, the region where the VOx density is $5.0\times10^{12}/\text{cm}^3$ or more corresponds to the bulk layer, and the region where the VOx density is $1.0\times10^{12}/\text{cm}^3$ or more and less than $5.0\times10^{12}/\text{cm}^3$ corresponds to the intermediate layer.

From the simulation results marked with V in FIG. 4, it is apparent that the higher the cooling rate, the shallower the width of the DZ layer, and the more steeply the VOx density rises. This is because as the cooling rate increases, a sufficient time is not given for vacancies to outwardly diffuse to the front side of the wafer during RTP, and the region having a high VOx density remains near the surface of the wafer.

From the simulation results marked with VI and VII in FIG. 4, it was found that the higher the processing temperature, the higher the VOx density. This is because the higher the temperature, the higher the thermal equilibrium density of vacancies and more VOx's are frozen in the wafer by RTP.

Furthermore, from the comparison of the simulation results marked with V and the simulation results marked with VI and VII in FIG. 4, it was found that the width of the DZ layer was wider when the oxygen atmosphere (here, the oxygen partial pressure is 100%) was used than when the atmosphere containing no oxygen (0% oxygen partial pressure) was used. This is because in the oxygen atmosphere, as described above, interstitial silicon atoms are injected into the wafer surface layer from the interface between the oxide film and the silicon crystal, and pair annihilation of the vacancies and the interstitial silicon atoms decreases the VOx density.

Figure 5A:
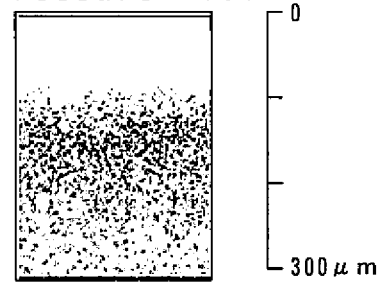
FIG. 5A is a diagram showing the wafer depth direction distribution of oxygen precipitates at a processing temperature of 1350° C., an oxygen partial pressure of 100%, and a cooling rate of 120° C./s.
Figure 5B:
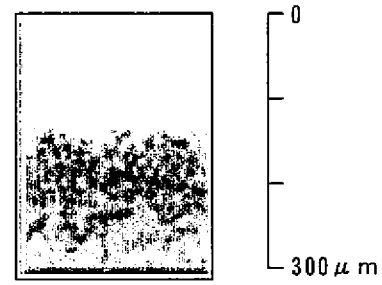
FIG. 5B is a diagram showing the wafer depth direction distribution of oxygen precipitates at a processing temperature of 1350° C., an oxygen partial pressure of 100%, and a cooling rate of 50° C./s.
Figure 5C:
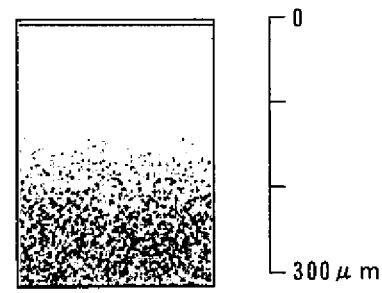
FIG. 5C is a diagram showing the wafer depth direction distribution of oxygen precipitates at a processing temperature of 1350° C., an oxygen partial pressure of 100%, and a cooling rate of 25° C./s.
Figure 6A:
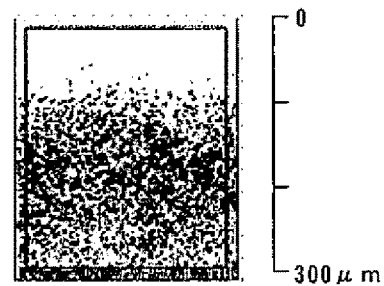
FIG. 6A is a diagram showing the wafer depth direction distribution of oxygen precipitates at a cooling rate of 25° C./s, an oxygen partial pressure of 0%, and a processing temperature of 1300° C.
Figure 6B:
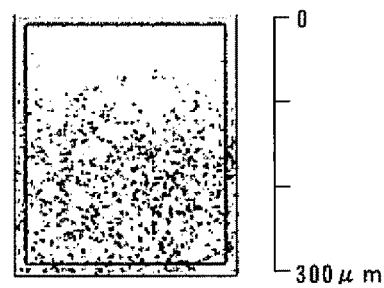
FIG. 6B is a diagram showing the wafer depth direction distribution of oxygen precipitates at a cooling rate of 25° C./s, an oxygen partial pressure of 0%, and a processing temperature of 1275° C.
Figure 6C:
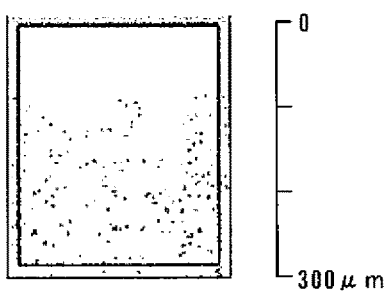
FIG. 6C is a diagram showing the wafer depth direction distribution of oxygen precipitates at a cooling rate of 25° C./s, an oxygen partial pressure of 0%, and a processing temperature of 1250° C.
Figure 7A:
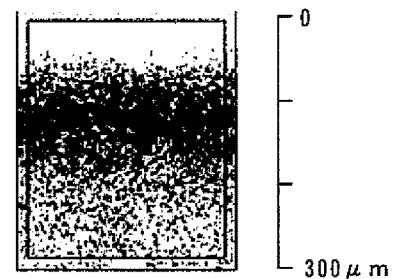
FIG. 7A is a diagram showing the wafer depth direction distribution of oxygen precipitates at a cooling rate of 120° C./s, an oxygen partial pressure of 0%, and a processing temperature of 1300° C.
Figure 7B:
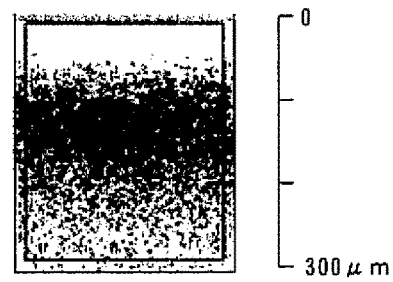
FIG. 7B is a diagram showing the wafer depth direction distribution of oxygen precipitates at a cooling rate of 120° C./s, an oxygen partial pressure of 0%, and a processing temperature of 1275° C.
Figure 7C:
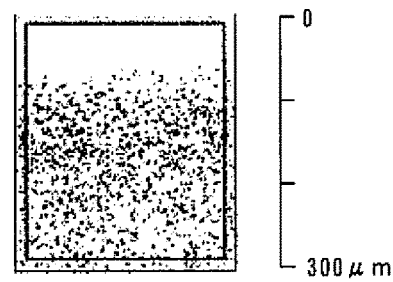
FIG. 7C is a diagram showing the wafer depth direction distribution of oxygen precipitates at a cooling rate of 120° C./s, an oxygen partial pressure of 0%, and a processing temperature of 1250° C.

After the RTP was actually performed under the thermal processing conditions described above, thermal processing was performed for revealing oxygen precipitates at 780° C. for three hours followed by 1000° C. for 16 hours. FIGS. 5A to 7C show measurement results of the wafer depth direction distribution of oxygen precipitates using an infrared scattering tomography apparatus (MO441; manufactured by Raytex Corporation). FIGS. 5A to 5C correspond to the simulation result marked with V in FIG. 4, FIGS. 6A to 6C correspond to the simulation result marked with VI in FIG. 4, and FIGS. 7A to 7C correspond to the simulation results marked with VII in FIG. 4. From the comparison of these simulation results and actual measurement results of the wafer depth direction distribution of oxygen precipitates, it was confirmed that the wafer depth direction distribution of oxygen precipitates can be accurately controlled by adjusting the depth direction distribution of the VOx density according to the RTP conditions.

A semiconductor device was formed on each of wafers shown in FIGS. 5A to 5C subjected to RTP under conditions of the cooling rates of 120° C./s (see FIG. 5A), 50° C./s (see FIG. 5B), and 25° C./s (see FIG. 5C), and the electrical characteristics of each semiconductor device were evaluated. As a result, the electrical characteristics of a semiconductor device formed in a region close to the surface (region shallower than about 60 μm) of any of the wafers were considerably favorable. In contrast, when a semiconductor device was formed in a region deeper than about 60 μm of a wafer subjected to RTP at a cooling rate of 120° C./s, when a semiconductor device was formed in a region deeper than about 90 μm of a wafer subjected to RTP at a cooling rate of 50° C./s, and when a semiconductor device was formed in a region (region having a VOx density of $1.0 \times 10^{12}/cm^3$ or more and denoted as "NG" in FIG. 4) deeper than about 130 μm of a wafer subjected to RTP at a cooling rate of 25° C./s, it was confirmed that the electrical characteristics of the semiconductor device tended to be inferior.

Figure 8:
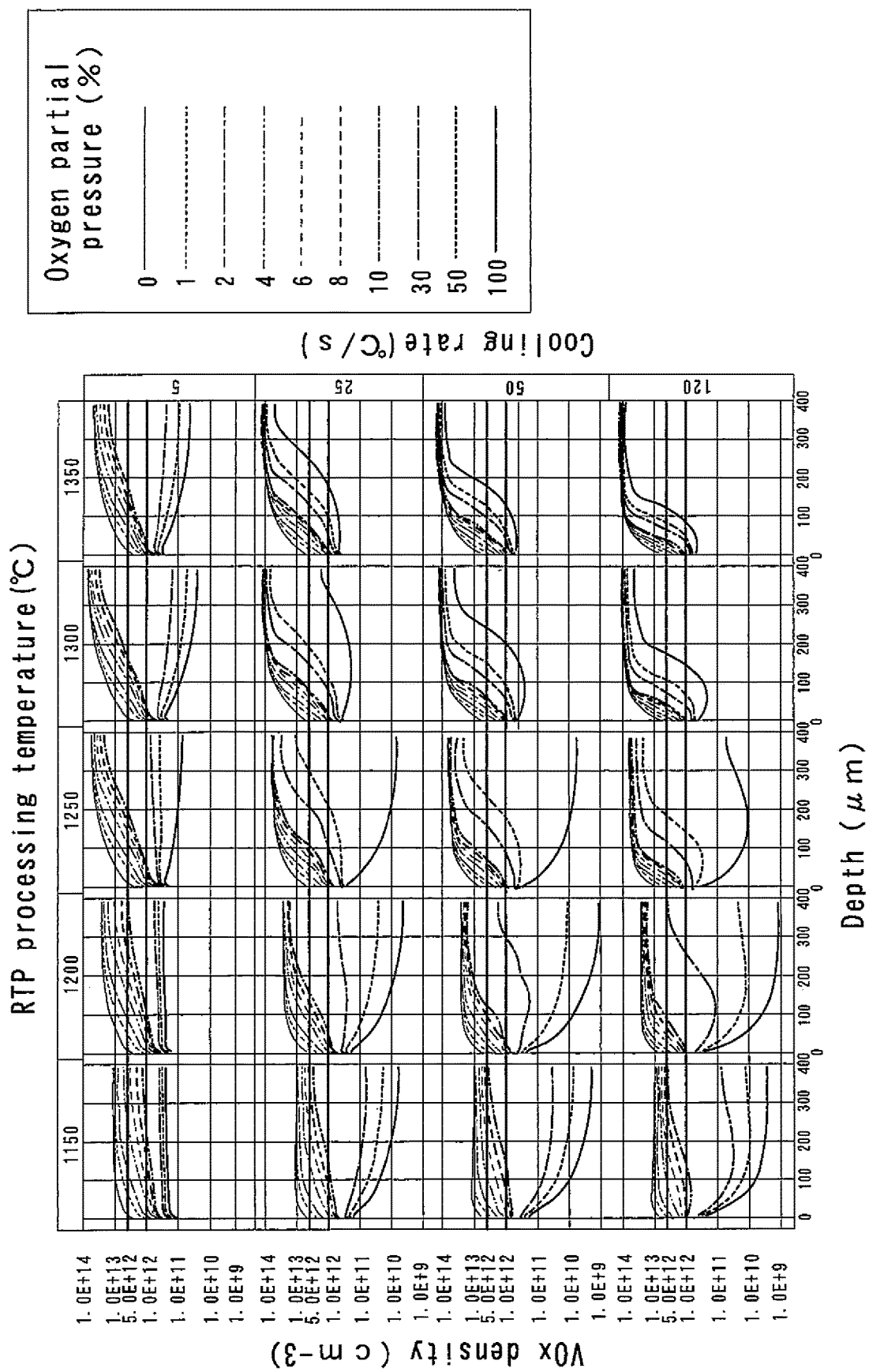
FIG. 8 is a diagram showing simulation results of the wafer depth direction distribution of the VOx density when the processing temperature was changed under five conditions ranging from 1350 to 11500° C. (at 50° C. pitch), the ramp up rate was set to 75° C./s, the cooling rate was changed under four conditions of 120, 50, 25, and 5° C./s, and the oxygen partial pressure was changed under 10 conditions of 100, 50, 30, 10, 8, 6, 4, 2, 1, and 0%.
Figure 9:
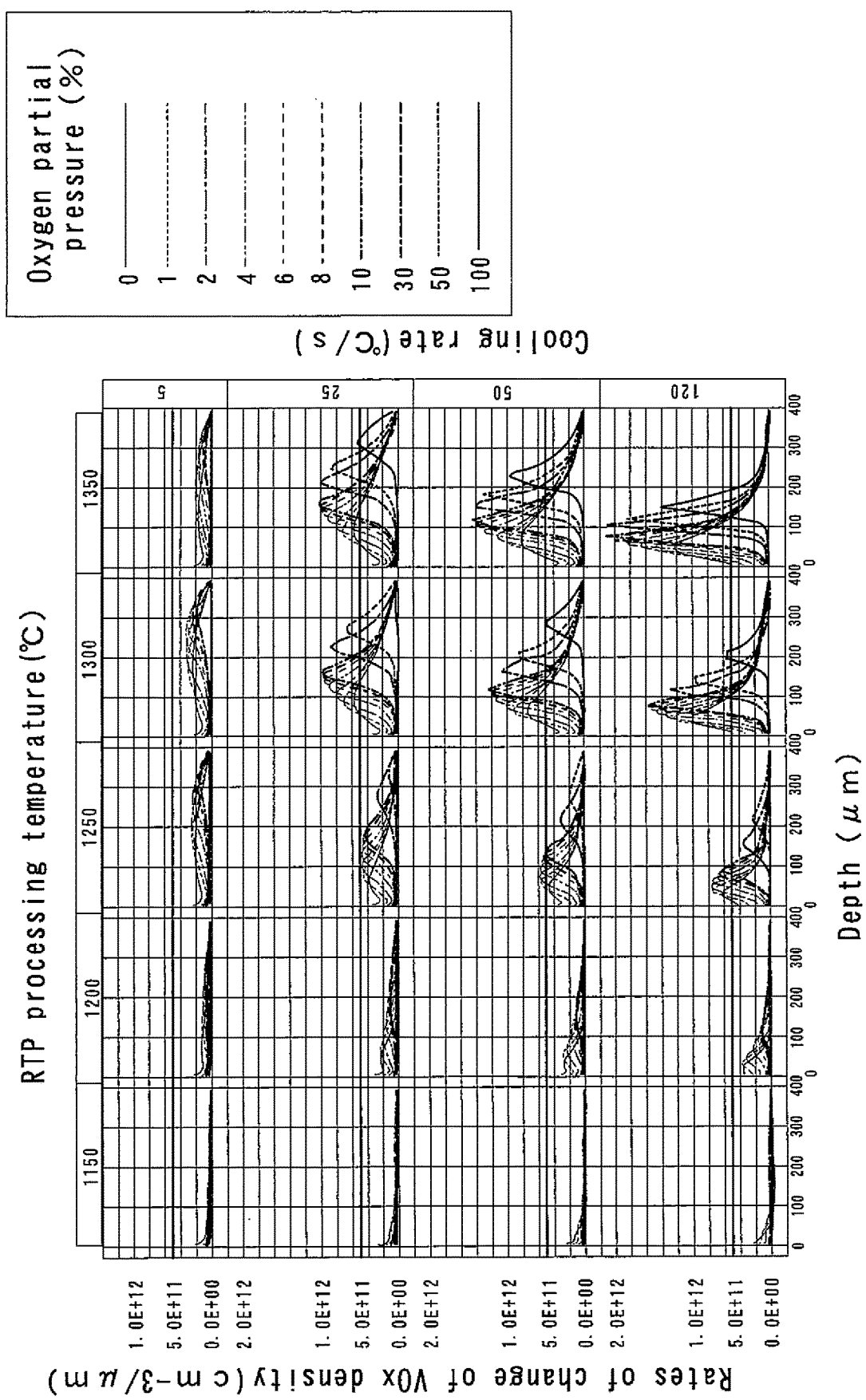
FIG. 9 is a diagram showing simulation results of the wafer depth direction distribution of the VOx density variation amount in the wafer depth direction (depth differentiation of the VOx density) in the simulation result shown in FIG. 8.

Further, FIG. 8 is a diagram showing simulation results of the wafer depth direction distribution of the VOx density when the processing temperature was changed under five conditions ranging from 1350 to 1150° C. (at 50° C. pitch), the ramp up rate was set to 75° C./s, the cooling rate was changed under four conditions of 120, 50, 25, and 5° C./s, and the oxygen partial pressure was changed under 10 conditions of 100, 50, 30, 10, 8, 6, 4, 2, 1, and 0% (under total of 200 conditions combining all conditions), and FIG. 9 is a diagram showing simulation results of the wafer depth direction distribution of the VOx density variation amount in the wafer depth direction (depth differentiation of the VOx's) in the simulation of FIG. 8.

According to the simulation result of FIG. 8, as described in FIG. 4, under conditions which the cooling rate and the oxygen partial pressure were fixed, although there were some exceptions, the higher the processing temperature, the higher the VOx density. Under conditions which the processing temperature and oxygen partial pressure were fixed, the higher the cooling rate, the higher the VOx density. Further, under conditions which the processing temperature and cooling rate were fixed, the higher the oxygen partial pressure, the lower the VOx density.

As described above, when the region having a VOx density of less than $1.0 \times 10^{12}/cm^3$ is defined as the DZ layer, the region having a VOx density of $1.0 \times 10^{12}/cm^3$ or more and less than $5.0 \times 10^{12}/cm^3$ is defined as the intermediate layer, and the region having a VOx density of $5.0 \times 10^{12}/cm^3$ or more is defined as the bulk layer, whether or not each of these layers is formed by RTP and the thickness of each layer formed by RTP largely change depending on the processing conditions of RTP.

As shown in FIG. 8, for example, when RTP is performed under the conditions of a processing temperature of 1350° C., a ramp up rate of 75° C./s, a cooling rate of 120° C./s, and an oxygen partial pressure of 30%, a DZ layer with a thickness of about 15 μm is formed on the wafer, and an intermediate layer with a thickness of about 50 μm is formed on the wafer. When RTP is performed under conditions of a processing temperature of 1350° C., a ramp up rate of 75° C./s, a cooling rate of 50° C./s, and an oxygen partial pressure of 10%, a DZ layer of about 4 μm is formed on the wafer and an intermediate layer having a thickness of about 59 μm is formed on the wafer.

In contrast, for example, when RTP is performed on a wafer under conditions of a processing temperature of 1350° C., a ramp up rate of 75° C./s, a cooling rate of 120° C./s, and an oxygen partial pressure of 10%, no DZ layer is formed, and when RTP is performed on a wafer under conditions of a processing temperature of 1350° C., a ramp up rate of 75° C./s, a cooling rate of 5° C./s, and an oxygen partial pressure of 30%, no intermediate layer and no bulk layer are formed, in any of the above cases, the wafer is unusable as a substrate for semiconductor devices.

As described above, by performing simulation using the RTP conditions (processing temperature, cooling rate, oxygen partial pressure) as parameters, it is possible to conveniently derive the wafer depth direction distribution of the VOx density which is very difficult to directly evaluate, and it is possible to conveniently determine processing conditions of a wafer having a DZ layer and an intermediate layer having desired thicknesses.

According to the simulation result of FIG. 9, under conditions which the cooling rate and oxygen partial pressure were fixed, although there are some exceptions, the higher the processing temperature, the higher the maximum value of the amount of change (differential value) of the VOx density in the wafer depth direction, and the position of the maximum value moved to the vicinity of the surface of the wafer. Under conditions which the processing temperature and oxygen partial pressure were fixed, the higher the cooling rate, the higher the maximum value of the differential value, and the maximum value moved to the vicinity of the surface of the wafer. Further, under conditions which the processing temperature and the cooling rate were fixed, when the oxygen partial pressure was around 10%, the maximum value of the differential value was the largest, and when the oxygen partial pressure was lower or higher than about 10%, the maximum value was lower. As the oxygen partial pressure increased, the maximum value moved toward the center of the thickness of the wafer.

The rise of the VOx density in the intermediate layer becomes steeper as the maximum value of the differential value becomes larger, so that the DZ layer and the bulk layer can be brought closer to each other via the intermediate layer. In this way, by bringing these layers close to each other, the diffusion length of heavy metals can be shortened, and gettering can be performed efficiently. By setting the position of the maximum value near the surface of the wafer, it is possible to efficiently getter in the same manner as described above even for heavy metals such as molybdenum, tungsten, and cobalt which have a small diffusion coefficient and are difficult to getter.

Figure 10A:
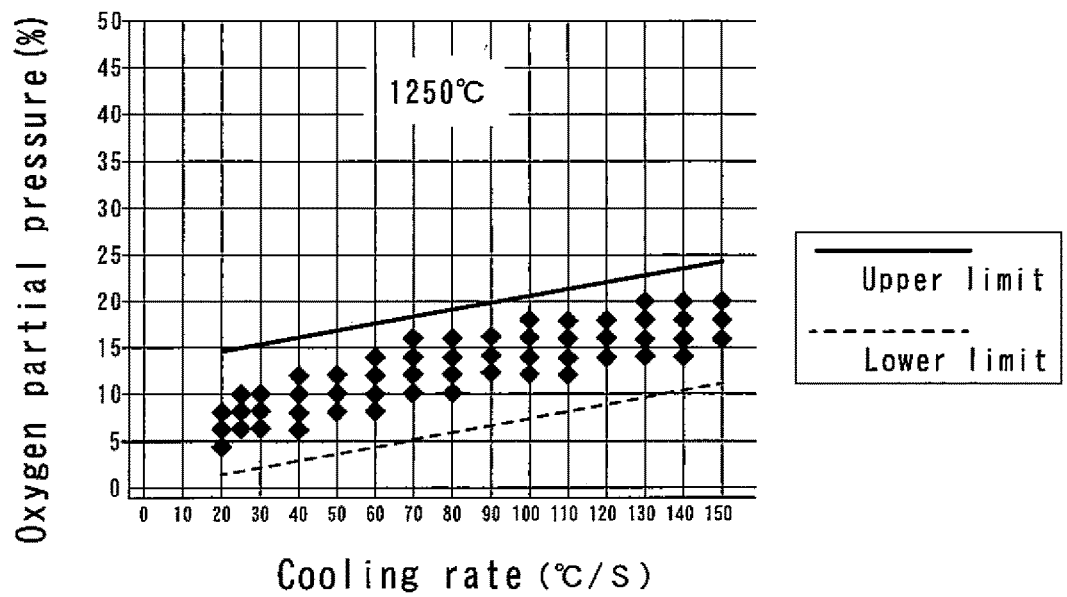
FIG. 10A is a diagram showing the relationship between the cooling rate and the oxygen partial pressure in a simulation result at a processing temperature of 1250° C. for a silicon wafer having both the integrity of a DZ layer and the gettering ability of a bulk layer.
Figure 10B:
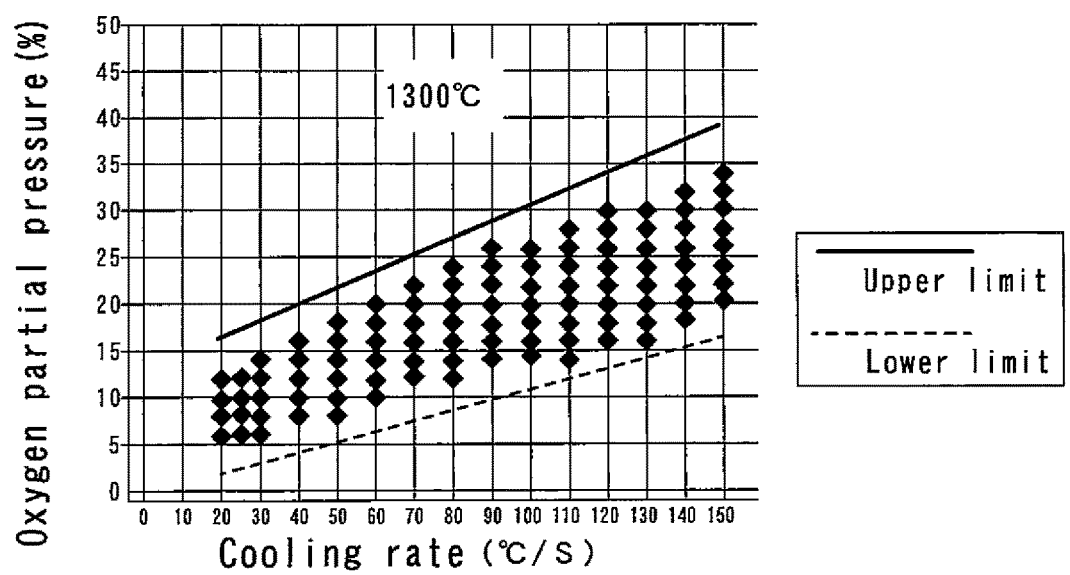
FIG. 10B is a diagram showing the relationship between the cooling rate and the oxygen partial pressure in a simulation result at a processing temperature of 1300° C. for a silicon wafer having both the integrity of a DZ layer and the gettering ability of a bulk layer.
Figure 10C:
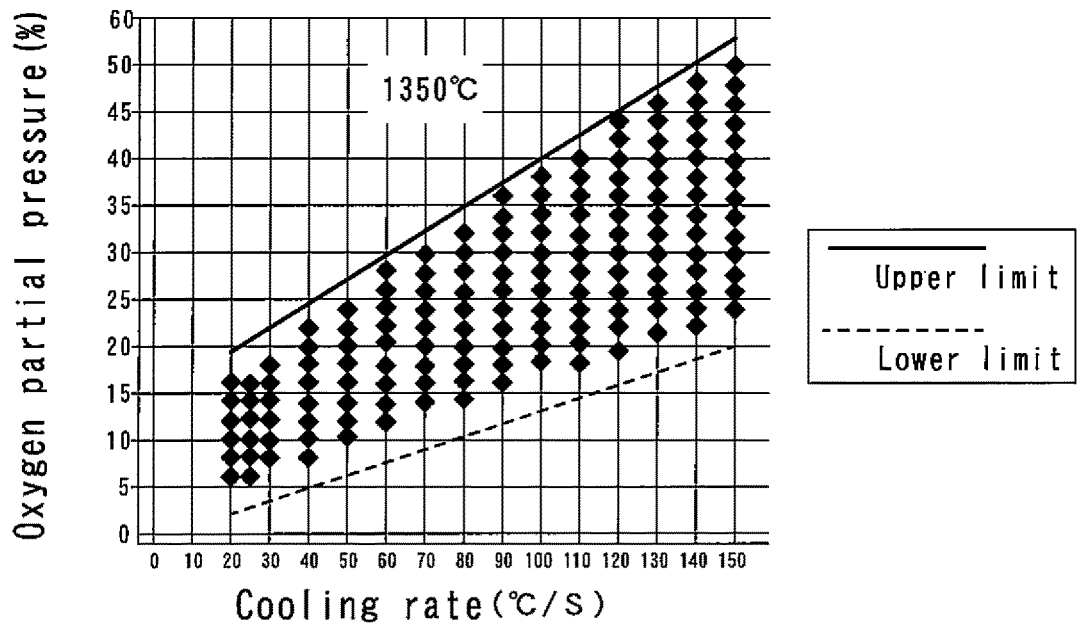
FIG. 10C is a diagram showing the relationship between the cooling rate and the oxygen partial pressure in a simulation result at a processing temperature of 1350° C. for a silicon wafer having both the integrity of a DZ layer and the gettering ability of a bulk layer.

(2) Regarding Regression Analysis (a) Determination of Upper Limit and Lower Limit of Oxygen Partial Pressure From the simulation results shown in FIG. 8, data of a wafer including both a DZ layer with high integrity and a bulk layer with high gettering ability or data of a wafer thermally processed at RTP conditions (processing temperature, cooling rate, and oxygen partial pressure) in which the VOx density of the DZ layer is less than $1.0 \times 10^{12}/cm^3$ and the VOx density of the bulk layer is $5.0 \times 10^{12}/cm^3$ or more was picked up and plotted in FIGS. 10A to 10C. FIG. 10A shows the results when the processing temperature was 1250° C., FIG. 10B shows the results when the processing temperature was 1300° C., and FIG. 10C shows the results when the processing temperature was 1350° C.

Next, a regression equation composed of three parameters of processing temperature $T_S$, cooling rate $R_d$, and oxygen partial pressure P was derived in such a manner that the picked-up RTP conditions were included. This regression equation is composed of the equation (A) representing the upper limit of the oxygen partial pressure P and the equation (B) showing the lower limit of the oxygen partial pressure P.

[Math. 34]

$$P = 0.00207 T_S \cdot R_d - 2.52 R_d + 13.3 \quad (A)$$

[Math. 35]

$$P = 0.000548 T_S \cdot R_d - 0.605 R_d - 0.511 \quad (B)$$

By determining the set of three parameters of the processing temperature, the cooling rate, and the oxygen partial pressure so as to satisfy the upper limit equation and the lower limit equation, it is possible to conveniently determine the thermal processing conditions of a wafer including both a DZ layer with high integrity and a bulk layer with high gettering ability.

The simulation results plotted in FIGS. 10A to 10C include both information on the width of the DZ layer and information on the width of the intermediate layer. Therefore, the information on the width of the DZ layer is described in FIGS. 11A to 11C, separately from the information on the width of the intermediate layer, which is described in FIGS. 12A to 12C. The size of the circle of each plot in FIGS. 11A to 12C corresponds to the size of the width of the corresponding DZ layer (FIGS. 11A to 11C) and the size of the width of the intermediate layer (FIGS. 12A to 12C).

Figure 11A:
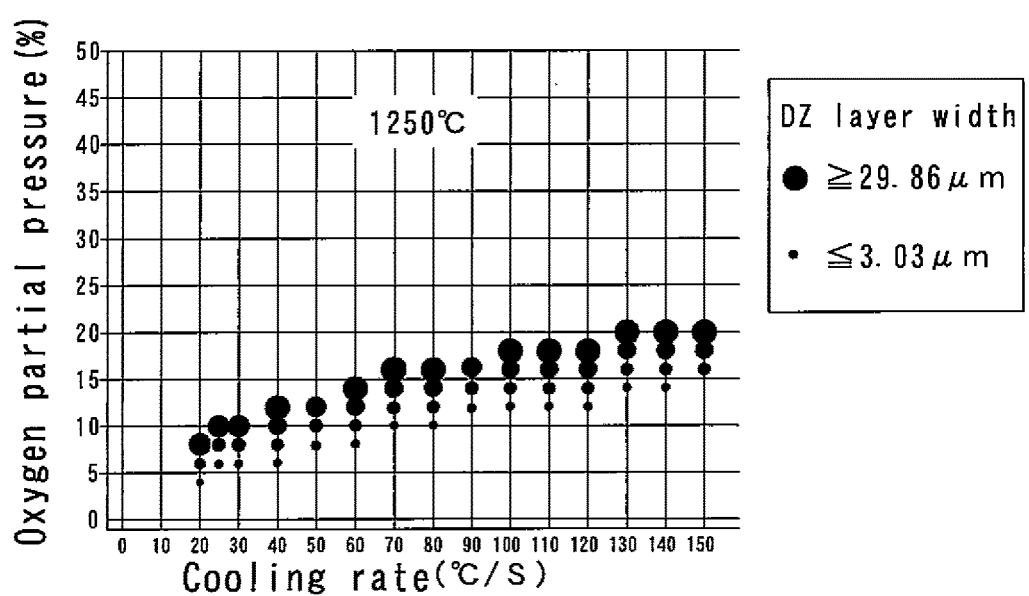
FIG. 11A is a diagram showing the width of a DZ layer in each simulation result shown in FIGS. 10A to 10C when the processing temperature is 1250° C.
Figure 11B:
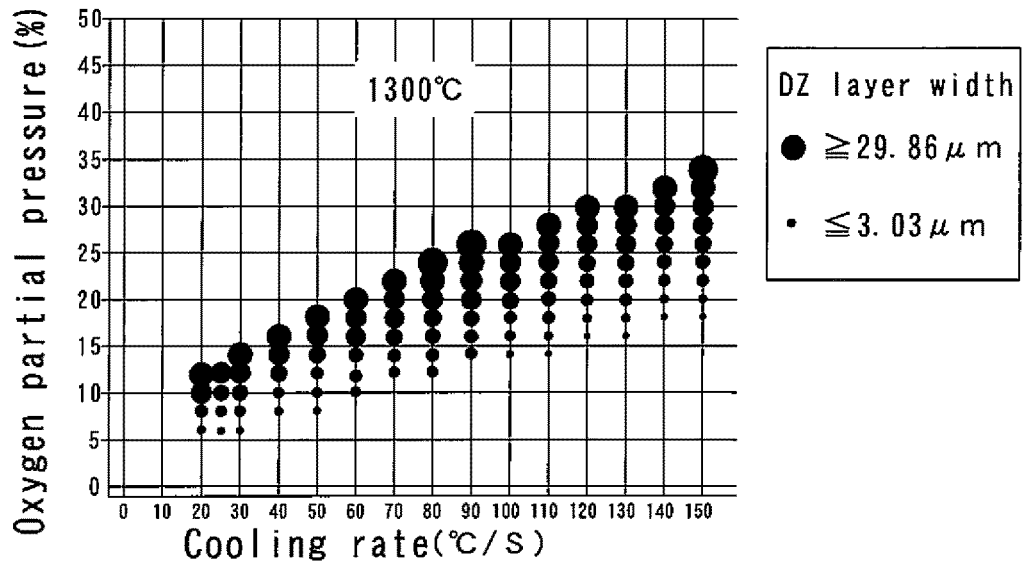
FIG. 11B is a diagram showing the width of a DZ layer in each simulation result shown in FIGS. 10A to 10C when the processing temperature is 1300° C.
Figure 11C:
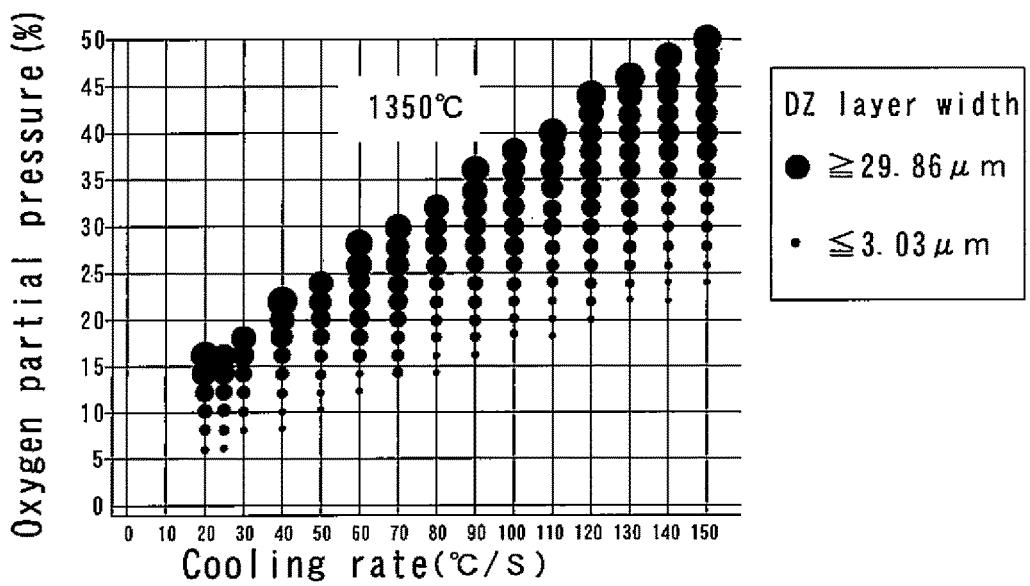
FIG. 11C is a diagram showing the width of a DZ layer in each simulation result shown in FIGS. 10A to 10C when the processing temperature is 1350° C.

The plot of the maximum size in FIGS. 11A to 11C indicates that the width of the DZ layer is about 30 μm or more, and the plot of the minimum size indicates that the width of the DZ layer is about 3 μm or less. From this simulation result, it is apparent that the larger the cooling rate, the lower the oxygen partial pressure, or the higher the processing temperature, the smaller the width of the DZ layer.

Figure 12A:
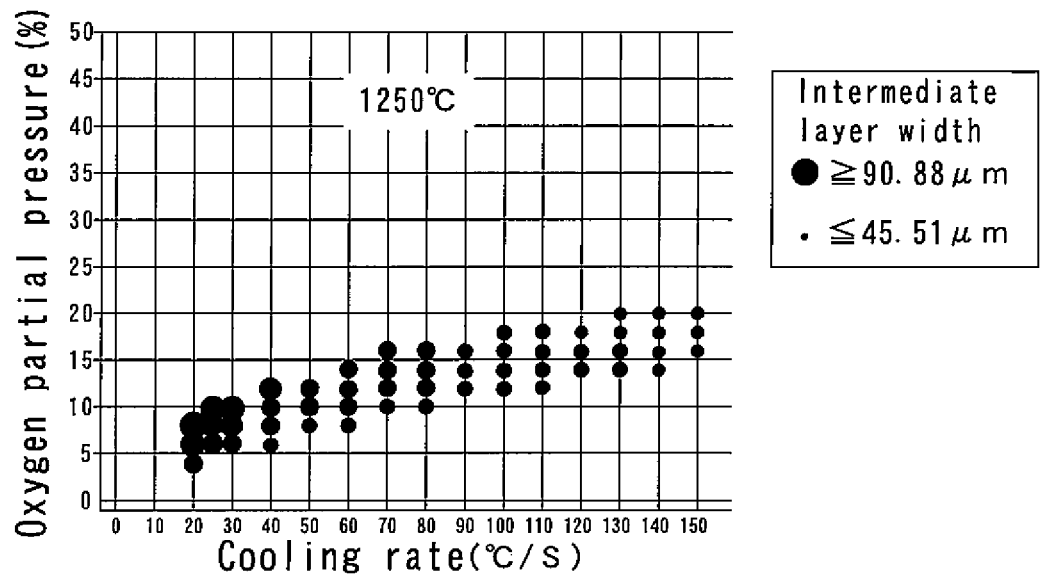
FIG. 12A is a diagram showing the width of an intermediate layer in each simulation result shown in FIGS. 10A to 10C when the processing temperature is 1250° C.
Figure 12B:
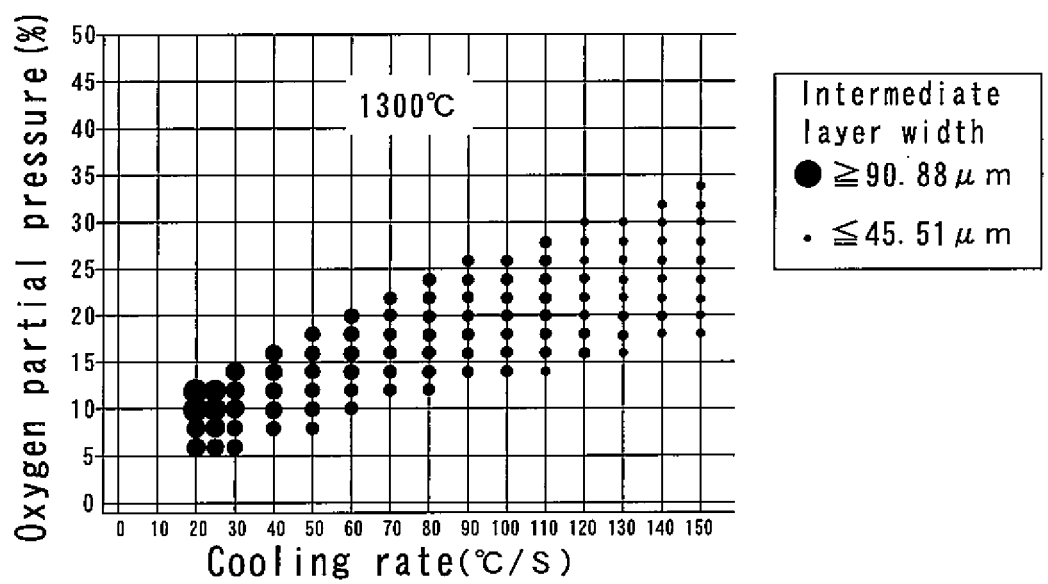
FIG. 12B is a diagram showing the width of an intermediate layer in each simulation result shown in FIGS. 10A to 10C when the processing temperature is 1300° C.
Figure 12C:
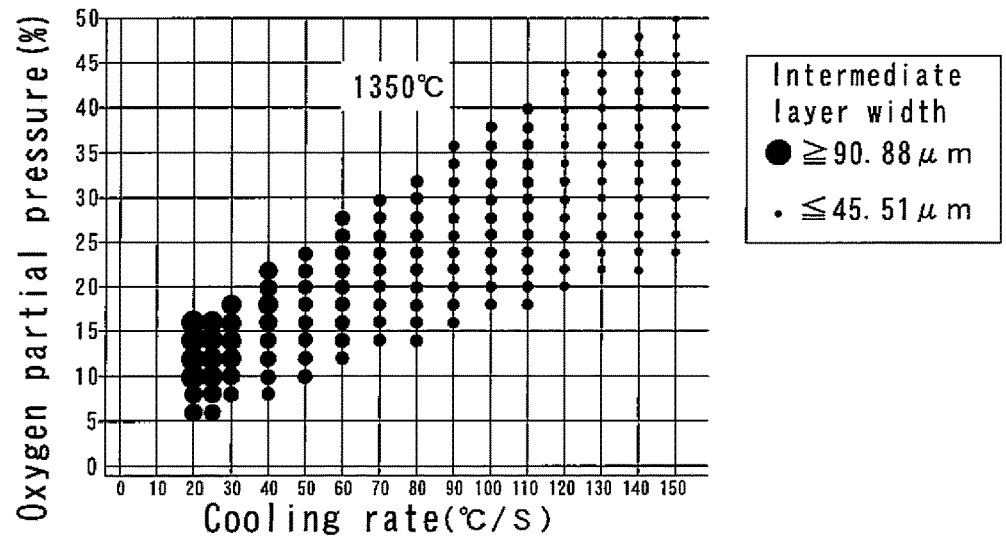
FIG. 12C is a diagram showing the width of an intermediate layer in each simulation result shown in FIGS. 10A to 10C when the processing temperature is 1350° C.

The plot of the maximum size in FIGS. 12A to 12C indicates that the width of the intermediate layer is about 91 μm or more, and the plot of the minimum size indicates that the width of the intermediate layer is about 46 μm or less. From this simulation result, it is apparent that the larger the cooling rate, or the higher the processing temperature, the smaller the width of the intermediate layer. It is also found that the oxygen partial pressure does not significantly affect the magnitude of the width of the intermediate layer.

(b) Prediction of Widths of DZ Layer and Intermediate Layer

From the simulation results shown in FIG. 8, data of a wafer including both a DZ layer with high integrity and a bulk layer with high gettering ability or data of a wafer thermally processed at RTP conditions (processing temperature, cooling rate, and oxygen partial pressure) in which the VOx density of the DZ layer is less than $1.0 \times 10^{12}/cm^3$ and the VOx density of the bulk layer is $5.0 \times 10^{12}/cm^3$ or more was picked up, a regression equation was derived from these picked up data, and using the regression equation, the widths of the DZ layer and the intermediate layer predicted from the RTP conditions were derived.

Figure 13:
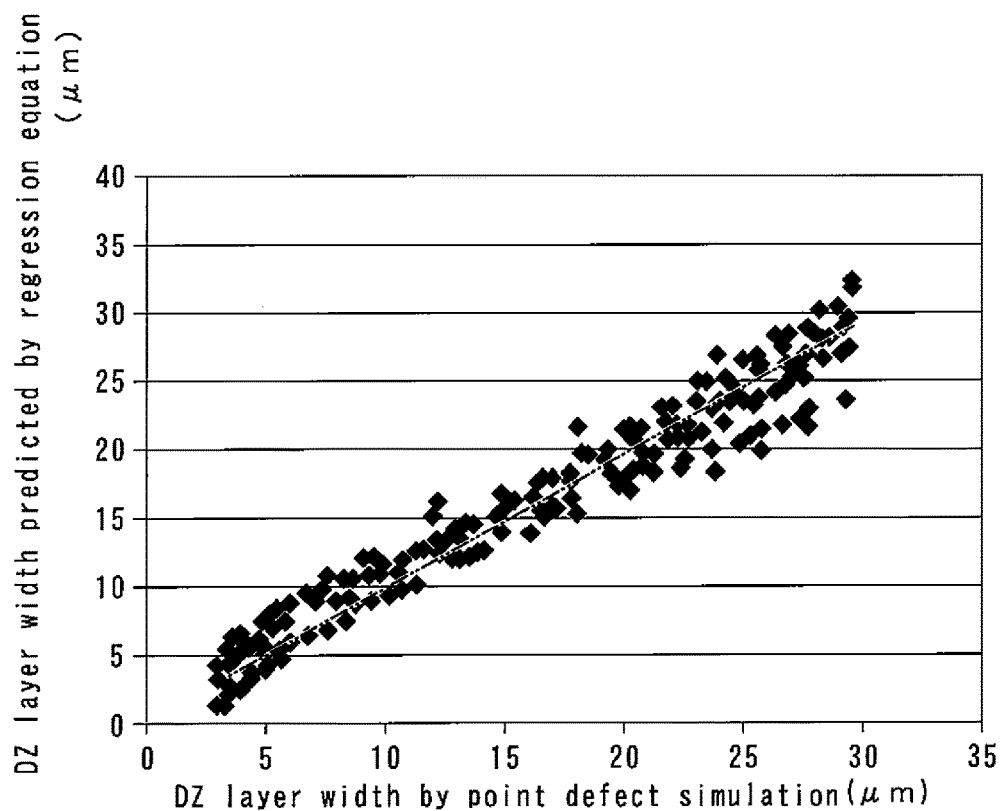
FIG. 13 is a diagram showing the correlation between the width of a DZ layer by a point defect simulation and the width of a DZ layer predicted by a regression equation (regression equation is prepared from a processing temperature, a cooling rate, and an oxygen partial pressure).
Figure 14:
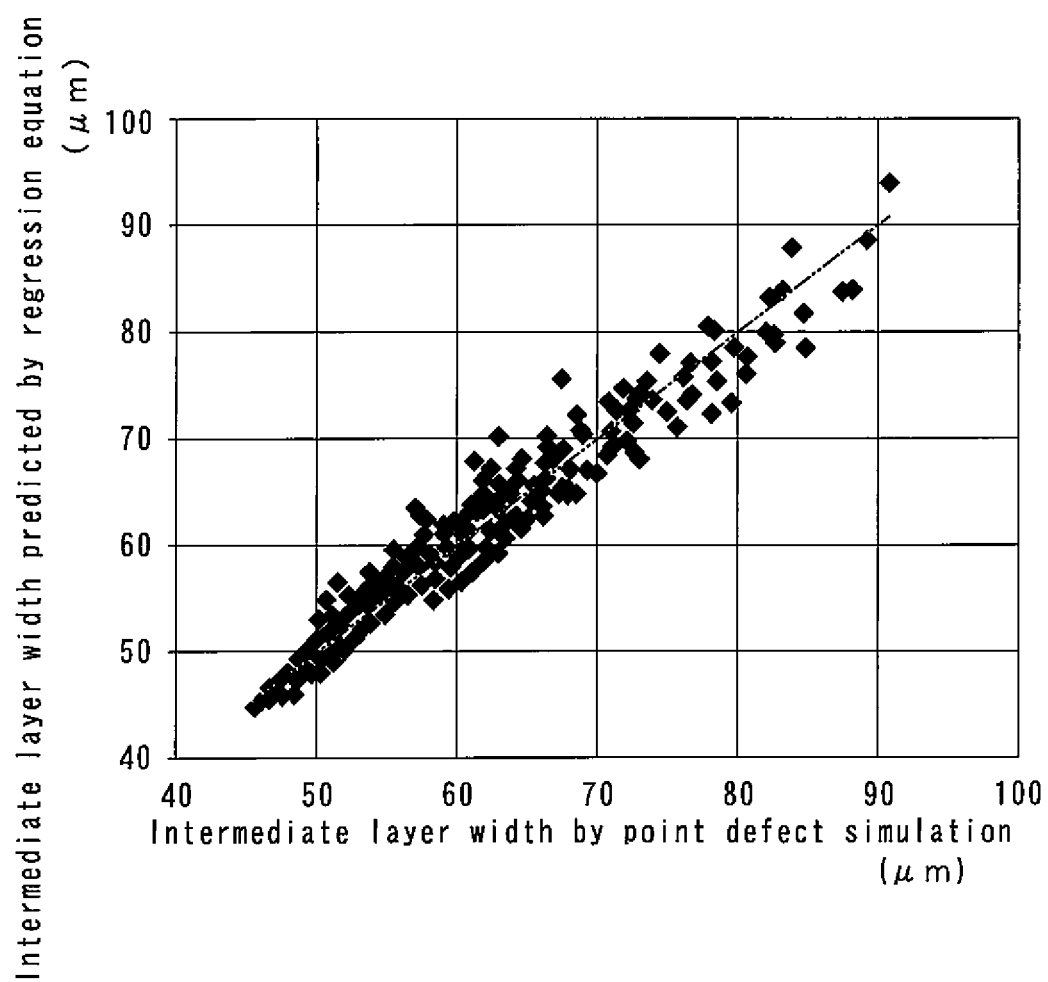
FIG. 14 is a diagram showing the correlation between the width of an intermediate layer by a point defect simulation and the width of an intermediate layer predicted by a regression equation (regression equation is prepared from a processing temperature, a cooling rate, and an oxygen partial pressure).

FIG. 13 is a diagram showing the correlation between the width of a DZ layer by a point defect simulation and the width of a DZ layer predicted by a regression equation, and FIG. 14 is a diagram showing the correlation between the width of an intermediate layer by a point defect simulation and the width of an intermediate layer predicted by a regression equation. The regression equation of the width $W_{DZ}$ of the DZ layer is represented by Formula (C), and the regression equation of the width $W_{Inter}$ of the intermediate layer is represented by Formula (D).

[Math. 36]

$$W_{DZ} = -0.129 R_d + 15.6 P - 0.0109 T_S \cdot R_d + 34.2 P/R_d - 7.95 \quad (C)$$

[Math. 37]

$$W_{Inter} = -0.141 T_S - 6.74 P + 0.00456 T_S \cdot R_d + 62.7 P/R_d + 243.1 \quad (D)$$

By substituting the processing temperature $T_S$, the cooling rate $R_d$, and the oxygen partial pressure P into Formulae (C) and (D), it is possible to accurately predict the widths $W_{DZ}$ and $W_{Inter}$ of the DZ layer and the intermediate layer (the width of the DZ layer is within the error range of ±5 μm and the width of the intermediate layer is within the error range of ±10 μm), and it is possible to easily determine the RTP conditions for forming desired DZ layer and intermediate layer with the widths $W_{DZ}$ and $W_{Inter}$ on the wafer with performing as few as possible experiments involving trial and error.

The above-described embodiment is merely an example, and as long as an object of the present invention, to conveniently determine thermal processing conditions which both the integrity of the denuded zone (DZ layer) and the high gettering ability in the bulk layer can be obtained, is achieved, it is acceptable, for example, to change the parameters of the regression equation.

The present invention can also be applied to crystals to which nitrogen is added at the time of crystal production in order to facilitate the annihilation of cavity defects even in short time thermal processing such as RTP. In such cases, the nitrogen concentration of such a crystal is desirably $1 \times 10^{13}$ or more and $4 \times 10^{15}$ cm$^{-3}$ or less, and more desirably $2 \times 10^{14}$ or more and $2 \times 10^{15}$ cm$^{-3}$ or less.

The invention claimed is:

1. A thermal processing method for a silicon wafer, comprising:
    determining, by a point defect simulation for predicting behavior of vacancies and interstitial silicon atoms in the silicon wafer during thermal processing, combinations each comprising a predetermined value of a processing temperature $T_S$, a predetermined value of a cooling rate $R_d$, and a predetermined value of an oxygen partial pressure P, and each determining a value of a width $W_{DZ}$ of a denuded zone;

determining, based on the combinations, a regression equation relating the width $W_{DZ}$ of the denuded zone to the processing temperature $T_S$, the cooling rate $R_d$, and the oxygen partial pressure P; and determining a combination of a specific value of the processing temperature $T_S$, a specific value of the cooling rate $R_d$, and a specific value of the oxygen partial pressure P for obtaining a denuded zone with a desired width by using the regression equation, wherein the regression equation is represented by the following formula (C), and the width $W_{DZ}$ of the denuded zone is made predictable within an error range of ±5 μm $$w_{DZ} = -0.129R_d + 15.6P - 0.0109T_S \cdot R_d + 34.2P/R_d - 7.95 \quad (C).$$

2. The thermal processing method for a silicon wafer according to claim 1, comprising:

determining, by a point defect simulation for predicting a behavior of vacancies and interstitial silicon atoms in a silicon wafer during thermal processing, combinations each comprising a predetermined value of a processing temperature $T_S$, a predetermined value of a cooling rate $R_d$, and a predetermined value of an oxygen partial pressure P, and each determining a value of a width $W_{Inter}$ of an intermediate layer is obtained;

determining, based on the combinations, a regression equation relating the width $W_{Inter}$ of the intermediate layer to the processing temperature $T_S$, the cooling rate $R_d$, and the oxygen partial pressure P; and determining a combination of a specific value of the processing temperature $T_S$, a specific value of the cooling rate $R_d$, and a specific value of the oxygen partial pressure P for obtaining an intermediate layer with a desired width by using the regression equation.

3. The thermal processing method for a silicon wafer according to claim 2, wherein the regression equation is represented by the following Formula (D), and the width $W_{Inter}$ of the intermediate layer is made predictable within an error range of ±10 μm $$W_{Inter} = -0.141T_S - 6.74P + 0.00456T_S \cdot R_d + 62.7P/R_d + 243.1 \quad (D).$$

4. A thermal processing method for a silicon wafer, comprising:

determining, by a point defect simulation for predicting behavior of vacancies and interstitial silicon atoms in the silicon wafer during thermal processing, combinations each comprising a predetermined value of a processing temperature $T_S$, a predetermined value of a cooling rate $R_d$, and a predetermined value of an oxygen partial pressure P, and each determining a value of a width $W_{DZ}$ of a denuded zone;

determining, based on the combinations, a regression equation relating the width $W_{DZ}$ of the denuded zone to the processing temperature $T_S$, the cooling rate $R_d$, and the oxygen partial pressure P;

determining a combination of a specific value of the processing temperature $T_S$, a specific value of the cooling rate $R_d$, and a specific value of the oxygen partial pressure P for obtaining a denuded zone with a desired width by using the regression equation;

determining, by a point defect simulation for predicting a behavior of vacancies and interstitial silicon atoms in a silicon wafer during thermal processing, combinations each comprising a predetermined value of a processing temperature $T_S$, a predetermined value of a cooling rate $R_d$, and a predetermined value of an oxygen partial pressure P, and each determining a value of a width $W_{Inter}$ of an intermediate layer is obtained;

determining, based on the combinations, a regression equation relating the width $W_{Inter}$ of the intermediate layer to the processing temperature $T_S$, the cooling rate $R_d$, and the oxygen partial pressure P; and determining a combination of a specific value of the processing temperature $T_S$, a specific value of the cooling rate $R_d$, and a specific value of the oxygen partial pressure P for obtaining an intermediate layer with a desired width by using the regression equation, wherein the regression equation is represented by the following Formula (D), and the width $W_{Inter}$ of the intermediate layer is made predictable within an error range of ±10 μm $$W_{Inter} = -0.141T_S - 6.74P + 0.00456T_S \cdot R_d + 62.7P/R_d + 243.1 \quad (D).$$

* * * * *